(12) United States Patent
Origasa et al.

(10) Patent No.: US 6,842,388 B2
(45) Date of Patent: Jan. 11, 2005

(54) SEMICONDUCTOR MEMORY DEVICE WITH BIT LINE PRECHARGE VOLTAGE GENERATING CIRCUIT

(75) Inventors: Kenichi Origasa, Takatsuki (JP); Kiyoto Ohta, Takatsuki (JP); Masanobu Hirose, Kameoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 79 days.

(21) Appl. No.: 10/300,499

(22) Filed: Nov. 19, 2002

(65) Prior Publication Data

US 2003/0095430 A1 May 22, 2003

(30) Foreign Application Priority Data

Nov. 20, 2001 (JP) ........................................ 2001-354302

(51) Int. Cl.⁷ .................................................. G11C 7/00
(52) U.S. Cl. ...................................................... 365/203
(58) Field of Search ................................ 365/203, 194, 365/201, 189.09, 222

(56) References Cited

U.S. PATENT DOCUMENTS

| | | | |
|---|---|---|---|
| 4,370,737 A | * | 1/1983 | Chan ............................ 365/203 |
| 4,943,960 A | | 7/1990 | Komatsu et al. |
| 5,289,424 A | | 2/1994 | Ito et al. |
| 5,689,460 A | | 11/1997 | Ooishi |
| 6,002,624 A | | 12/1999 | Tashiro |
| 6,057,676 A | * | 5/2000 | Lee et al. .................... 323/316 |
| 6,081,468 A | | 6/2000 | Taira et al. |
| 6,236,603 B1 | | 5/2001 | Cleveland |
| 6,326,837 B1 | | 12/2001 | Matano |
| 6,538,942 B2 | * | 3/2003 | Ferrant ........................ 365/203 |

FOREIGN PATENT DOCUMENTS

| | | |
|---|---|---|
| CN | 1206195 A | 1/1999 |
| JP | 62-51094 | 3/1987 |
| JP | 2-29989 | 1/1990 |
| JP | 5-166368 | 7/1993 |
| JP | 8-190437 | 7/1996 |
| JP | 11-86554 | 3/1999 |
| JP | 2000-36190 | 2/2000 |
| JP | 2001-14848 | 1/2001 |

* cited by examiner

Primary Examiner—Thong Q. Le
(74) Attorney, Agent, or Firm—Merchant & Gould P.C.

(57) ABSTRACT

The present invention is a semiconductor memory device provided with bit line pairs to which a plurality of memory cells are attached, a plurality of precharge circuits for precharging the bit line pairs to a first voltage that is different from a mean value between a high level and a low level, a bit line precharge power line for supplying the first voltage for precharging to the precharge circuits, a capacitor, a charging circuit for charging the capacitor, and transfer gate circuits for controlling connection and disconnection of the capacitor and the bit line precharge power line. The transfer gate circuits are controlled so that the capacitor and the precharge power line are connected during precharging of the bit line pairs. Thus, precharging of the bit lines can be performed at high speeds with high precision.

11 Claims, 26 Drawing Sheets

SEMICONDUCTOR MEMORY DEVICE WITH BIT LINE PRECHARGE VOLTAGE GENERATING CIRCUIT

BACKGROUND OF THE INVENTION

1. Field of the Invention

The present invention relates to semiconductor memory devices, and in particular to semiconductor memory devices such as DRAMs (dynamic random access memories) provided with a bit line precharge voltage generating device that is capable of quickly performing a precharge operation if the precharge potential of the bit lines differs from a middle potential of the bit line pair.

2. Description of the Related Art

The circuit configuration and the operation of a semiconductor memory device in which a conventional bit line precharge voltage generating device is mounted are described below with reference to the drawings.

FIG. 19 shows a function block diagram of an ordinary DRAM 5000. Numeral 4000 denotes a memory array, 4001 denotes memory array blocks, 4002 denotes a power source block, 4003 denotes a row controller, 4004 denotes a column controller, 4005 denotes a control circuit, and 4006 denotes an I/O buffer.

The memory array 4000 includes a plurality of memory array blocks 4001. The power source block 4002 supplies the voltage necessary for the memory array 4000, such as the bit line precharge voltage VBP and the memory cell plate voltage VCP, to each memory array block 4001. Each memory array block 4001 is controlled by a bit line precharge signal NEQ, sense amplifier activation signals SAN and SAP, and a word line drive signal WL [63:0], which are input from the row controller 4003. Further, the memory array blocks 4001 are each connected to the column controller 4004.

The row controller 4003 receives the access control signal SE and the row address signal RAD from the control circuit 4005. The column controller 4004 receives the write enable signal WEN and the column address signal CAD from the control circuit 4005.

The control circuit 4005 receives an outside clock signal CLK, a row address strobe signal NRAS, a column address strobe signal NCAS, a write control signal NWE, an address ADDR, and a refresh control signal REF.

The column controller 4004 is connected to the I/O buffer 4006. The I/O buffer 4006 receives data input signals DI and outputs data output signals DO.

FIG. 20 is a circuit diagram of the memory array blocks 4001. Numeral 4100 is a memory cell, 4101 is a sense amplifier, 4102 is a precharge circuit, BL[n](n=0,1, ...) are bit lines, and /BL[n](n=0,1, ...) are bit lines paired with the bit lines BL[n]. The memory cell 4100 is made of a capacitor 4104 and an access transistor 4103, which is a p-channel transistor. The source of the access transistor 4103 is connected to the bit line BL[n] or /BL[n], the drain of the access transistor 4103 is connected to one node of the capacitor 4104, and the gate of the access transistor 4103 is connected to a word line drive signal WL[n] line. The other node of the capacitor 4104 is connected to the memory cell plate voltage VCP.

The sense amplifier 4101 is an ordinary cross-coupled sense amplifier, and is connected to the pair of bit lines BL[n] and /BL[n]. The sense amplifier 4101 is controlled by the sense amplifier activation signals SAN and SAP. The precharge circuit 4102 is made of three p-channel transistors. These are a transistor whose source is connected to the bit line BL[n], whose drain is connected to the bit line /BL[n], and whose gate is connected to the bit line precharge signal NEQ line, a transistor whose source is connected to the bit line BL[n], whose drain is connected to the bit line precharge voltage VBP, and whose gate is connected to the bit line precharge signal NEQ line, and a transistor whose source is connected to the bit line precharge voltage VBP, whose drain is connected to the bit line /BL[n], and whose gate is connected to the bit line precharge signal NEQ line.

FIG. 21 shows the power source wiring network of the bit line precharge voltage VBP. Bit line precharge power lines VBP[n] are arranged on the memory cell array 4000 so as to supply the bit line precharge voltage VBP from the precharge voltage generating circuit 4200 to the precharge circuits 4102 that are arranged in each memory array block 4001 (see FIG. 20). The bit line precharge power lines VBP[n] are expressed as VBP[0], VBP[1], ... VBP[n] in order from the side near the precharge voltage generating circuit 4200. The bit line precharge power lines VBP[n] are disposed in the column direction as the wiring layer of the upper layer of each memory array block 4001 (in FIG. 21, shown by the solid lines). The bit line precharge power lines VBP[n] are connected to one another in the row direction by metal wiring (in FIG. 21, shown by the dashed lines) so as to lower the impedance. In this manner, the bit line precharge power lines VBP[n] are arranged in a matrix, and the thickest possible wiring is used. The bit line precharge power line VBP[0] is connected to the precharge voltage generating circuit 4200.

FIG. 22 shows a conventional precharge voltage generating circuit 4200. Numeral 4300 denotes a reference voltage generating circuit, 4301 denotes an operational amplifier, and 4302 denotes a p-channel transistor. VBPREF is the bit line precharge reference voltage, VOUT is the bit line precharge hold voltage, and PEN is the driver enable signal. The reference voltage generating circuit 4300 generates the bit line precharge reference voltage VBPREF and the bit line precharge hold voltage VOUT. The bit line precharge reference voltage VBPREF is connected to the −input of the operational amplifier 4301 and the bit line precharge hold voltage VOUT is connected to the bit line precharge power line VBP[0]. The +input of the operational amplifier 4301 is connected to the bit line precharge power line VBP[0]. The output of the operational amplifier 4301 is the driver enable signal PEN, and is input to the gate of the p-channel transistor 4302. The source of the p-channel transistor 4302 is connected to the VDD, and the drain of the p-channel transistor 4302 is connected to the bit line precharge power line VBP[0]. Thus the operational amplifier 4301 and the p-channel transistor 4302 compose a comparing and driving circuit.

FIG. 23 shows a circuit diagram of the reference voltage generating circuit 4300. Numeral 4400 denotes a resistor (resistor R1) and 4401 denotes a resistor (resistor R2). The circuit configuration is that of an ordinary ½ VDD generating circuit, which is described in detail in "Super LSI Memories" (authored by Kiyoo Itoh, Baifukan), and thus a detailed description thereof is omitted. The output stages are for generating the bit line precharge reference voltage VBPEREF and the bit line precharge hold voltage VOUT. The voltage that is output is VOUT=VBPREF=R2/(R1+R2)×VDD. Resistance values that are sufficiently larger than the on resistance of the transistors making up this circuit can be used as the values for R1 and R2.

The operational amplifier 4301 is an ordinary, current mirror load-type differential operational circuit such as that shown in FIG. 24. AMPEN is a differential amplifier control signal. As the differential input, the bit line precharge reference voltage VBPREF is connected to the −input and the bit line precharge power line VBP[0] is connected to the +input. The output is the driver enable signal PEN. When the differential amplifier control signal AMPEN is the VDD level, then the operational amplifier 4301 is in an operational state, and when it is the VSS level, the operational amplifier 4301 is in a stopped state, and current consumption can be reduced. As this circuit is well known, a more detailed explanation of its operation will be omitted.

FIG. 25 shows the operation timing and the internal voltage timing of a DRAM having the above configuration. Here, only the read operation is shown. In a non-operational state (stand-by), all word lines WL[n] are at a high level, all access transistors 4103 are off, and an arbitrary voltage is held in the capacitor 4104. Also, the bit line precharge signal NEQ is at a low level, all precharge circuits 4102 are in an operating state, and all bit lines BL[n] and /BL[n] are charged to the bit line precharge voltage VBP.

At the rising edge of the outside clock signal, the word line selection operation is started by setting the row address strobe signal NRAS to a low level and receiving a row address as the address ADDR. When the word line selection operation is started, the bit line precharge signal NEQ that is input to the arbitrary memory array block 4001 determined by the row address that is input is set to a high level. When the bit line precharge signal NEQ is set to a high level, the corresponding precharge circuit 4102 is stopped. Also, the differential amplifier control signal AMPEN is set to a high level and the operational amplifier is activated in order to prepare for the precharge operation.

Then, the word line WL[n] that is determined by the input row address is set to a low level (VSS), the plurality of memory cells 4100 that are connected thereto are turned on, and the voltage that is held in the capacitor 4104 is read to the connected bit line BL[n] or /BL[n]. Next, the sense amplifier activation signal SAN is set to a low level (VSS) and the sense amplifier activation signal SAP is set to a high level (VDD) so that the sense amplifier 4101 is activated. When the sense amplifier 4101 is activated, the bit line BL[n] or /BL[n] is charged to a low level (VSS) or a high level (VSS) based on the potential that is read to the bit line BL[n] or /BL[n].

Here, the word line WL[n] to which the memory cell 4100 that is read out is connected is set to a low level (VSS), so that the potential of the connected bit lines BL[n], /BL[n] is once again written into the capacitor 4104. The access transistor 4103 is a p-channel transistor, and therefore a potential of Vtp (the threshold voltage of a p-channel transistor) is written as the low level and VDD is written as the high level. That is, the voltage that is written to the capacitor 4104 is VDD if high level and Vtp if low level. In order to read out both the high level read potential and the low level read potential with an optimal margin, the bit line precharge voltage VBP is ideally ½(VDD+Vtp), which is the mean value between them.

Then, by setting the column address strobe signal NCAS to a low level and inputting a column address as the address ADDR in synchronization with the rising edge of the outside clock signal CLK, the column controller 4004 is activated and data are output as data output signals DO.

Next, by setting the row address strobe signal NRAS and the column address strobe signal NCAS to a high level in synchronization with the rising edge of the outside clock signal CLK, the precharge operation is started. When the precharge operation is started, the word line WL[n] is set from a low level to a high level, the access transistor 4103 is turned off, and a charge is held in the capacitor 4104. To prepare for the next read operation, the bit line precharge signal NEQ is set to a low level and the precharge circuit 4102 is activated.

When the precharge circuit 4102 is activated, the potentials of the bit lines BL[n], /BL[n], which are set to the potentials VDD and VSS, are equalized by the sense amplifier 4101 and charged to a potential of ½ VDD. The precharge circuit 4102 simultaneously is connected to the bit line precharge power line VBP[n] corresponding to the bit lines BL[n], /BL[n] so as to charge to it the bit line precharge voltage VBP.

FIG. 26 shows the operation of the bit line precharge power line VBP[n] according to this conventional configuration during activation of the precharge circuit 4102. As mentioned previously, when the bit line precharge signal NEQ is set to a low level and the precharge circuit 4102 is activated, the activated bit lines BL[n], /BL[n], which are connected to the bit line precharge power line VBP[n], current is consumed and a drop in voltage occurs. The bit line precharge power line VBP[n] and the bit line precharge power line VBP[0] are connected in a lattice so as to lower the impedance, and transmission of the voltage is delayed by about several ns.

The bit line precharge power line VBP[0] is connected to the precharge voltage generating circuit 4200. At the point that the bit line precharge power line VBP[0] becomes a lower voltage than the bit line precharge reference voltage VBPREF, the driver enable signal PEN, which is output by the operational amplifier 4301, becomes lower toward the low level and the p-channel transistor 4302 is turned on, so that a high level voltage is supplied to the bit line precharge power line VBP[0]. At the point that the high level voltage supplied to the bit line precharge power line VBP[0] has increased the voltage to a higher voltage than the bit line precharge reference voltage VBPREF, the driver enable signal PEN, which is output by the operational amplifier 4301, rises toward the high level and the p-channel transistor 4302 is turned off.

Because the p-channel transistor 4302 requires current capabilities and is relatively large in size (W=50 µm or more), the drive enabler signal PEN is delayed with respect to the relationship between the bit line precharge power line VBP[0] and the bit line precharge reference voltage VBPREF, and as shown in FIG. 26, the current ia that flows through the p-channel transistor 4302 is delayed.

To achieve a stable read during the next read operation, the voltage of the bit lines BL[n], /BL[n] must be kept within a predetermined range. However, with the conventional bit line precharge voltage generating device 4200, the operation of the operational amplifier 4301 is slow and it is difficult to increase the speed of the precharge operation, and this was a problem. Although the speed of the precharge operation can be raised by increasing the current consumption of the operational amplifier 4301, the increase in power consumption becomes a problem.

SUMMARY OF THE INVENTION

It is an object of the present invention to provide a semiconductor memory device that is capable of very quickly and accurately precharging the bit lines.

A semiconductor memory device according to the present invention is provided with a plurality of memory cells, bit line pairs to which the memory cells are connected, a plurality of precharge circuits for precharging the bit line pairs to a first voltage that is different from a mean value between a high level and a low level in accordance with a first control signal, a bit line precharge power line for supplying the first voltage for precharging to the precharge circuits, a first capacitor, a charging circuit for charging the first capacitor, a transfer gate circuit for controlling connection and disconnection between the first capacitor and the bit line precharge power line, and a first control circuit for controlling the charging circuit and the transfer gate circuit. The first control circuit, in accordance with a second control signal, controls the transfer gate circuit so that the first capacitor and the bit line precharge power line are connected during precharging of the bit line pairs.

According to this configuration, the charge on the first capacitor is released during the precharge operation, so that the bit lines can be precharged at high speeds.

In the above configuration, it is possible to further provide a reference voltage generating circuit for generating a second voltage, and a comparing and driving circuit for driving the bit line precharge power line at the first voltage in accordance with reference to the second voltage.

In the above configuration, it is preferable that the first capacitor is made of a first MOS transistor whose source and drain are grounded, that the charging circuit is made of a first p-channel MOS transistor whose gate is connected to the second control signal, whose source is connected to a first outside power source, and whose drain is connected to the gate of the first MOS transistor, and that the transfer gate circuit is made of a first n-channel MOS transistor into whose gate the second control signal is input, whose source is connected to the gate of the first MOS transistor, and whose drain is connected to the precharge circuit, a first inverter into whose input the second control signal is supplied, and a second p-channel MOS transistor into whose gate an output of the first inverter is input, whose source is connected to the gate of the first MOS transistor, and whose drain is connected to the precharge circuit.

Thus, the bit lines can be precharged at high speeds with the smallest circuit configuration.

Further, the device may have a configuration in which the first control circuit, after a first delay time that starts when the first control signal has become a voltage that activates the precharge circuit, controls the second control signal to a first voltage level so that the first capacitor and the bit line precharge power line are connected, and after a further second delay time, the first control circuit controls the second control signal to a voltage of a phase opposite the first voltage level.

With this configuration, current is supplied from the first capacitor after the comparing and driving circuit has been activated, and thus the bit lines can be precharged at high speeds.

Additionally, the device may have a configuration in which, when a difference between a first outside power source voltage and the second voltage is taken as a first voltage difference, a difference between the second voltage and the mean voltage of the voltages of the bit line pairs is taken as a second voltage difference, and a total capacitance of simultaneously precharged bit line pairs is taken as a first capacitance, then a capacitance of the first capacitor is equivalent to a second capacitance obtained by multiplying the first capacitance with the ratio of the second voltage difference to the first voltage difference.

Also, it is preferable that when a difference between a first outside power source voltage and the second voltage is taken as a first voltage difference, a difference between the second voltage and the mean voltage of the voltages of the bit line pairs is taken as a second voltage difference, and a total capacitance of simultaneously precharged bit line pairs is taken as a first capacitance, then a capacitance of the first capacitor is a value of approximately 50% to 80% that of a second capacitance obtained by multiplying the first capacitance with the ratio of the second voltage difference to the first voltage difference.

Thus, an excess rise in voltage caused by a rise in the first voltage due to discharge of the first capacitor and a rise in the voltage from the comparing and driving circuit is prevented, and the bit lines can be precharged at high speeds with high accuracy.

Furthermore, the above configuration may be revised to such that the plurality of memory cells are refreshed in correspondence with a refresh control signal, wherein during a refresh operation, a greater number of bit line pairs are activated than in normal operation, and wherein the first control circuit enables a connection of the transfer gate circuit in correspondence with the first control signal only when the level of the refresh control signal indicates the refresh operation.

According to this configuration, the operation for precharging the bit lines can be performed at high speeds during the refresh operation. Also, the capacitance of the first capacitor can be set to a required size only during the refresh operation, the circuit area can be reduced, and the circuit configuration can be simplified.

Also, the above configuration may be revised to such that, responsive to a test signal, when not in test mode, the transfer gate circuit becomes connecting state in correspondence with the first control signal, and when in test mode, the first control circuit is stopped and the output of the first control circuit becomes high impedance, and the transfer gate circuit becomes disconnecting state.

According to this configuration, during testing, for example, the operation for precharging the bit lines is applied from the outside, and thus when confirming the operation margin, for example, a desired voltage can be achieved easily.

Further, the device may have a configuration in which the comparing and driving circuit compares the second voltage to a voltage of a portion of the bit line precharge power line coupled to a precharge circuit, of the plurality of precharge circuits, that is disposed around the portion farthest from the comparing and driving circuit, and based on a result of this comparison, drives a portion of the bit line precharge power line that is closest or near to the comparing and driving circuit.

According to this configuration, with respect to the entire memory array that is supplied, the operation for precharging the bit lines can be performed at relatively high speeds even with respect to memory array blocks that are far from the supply source of the voltage for precharging.

In a further configuration, the plurality of memory cells are divided into a plurality of memory array blocks and each memory array block includes a plurality of memory cells connected to the plurality of precharge circuits that are simultaneously driven by the first control signal, and a noise canceller is disposed at each memory array block, wherein the noise canceller is made of a second inverter and a second capacitor, the first control signal is input to the second inverter, an output of the second inverter is input to a terminal of the second capacitor, and the bit line precharge power line is coupled to another terminal of the second capacitor.

According to this configuration, the impact of coupling noise to the precharge voltage for the bit lines due to the first control signal can be cancelled out, so that the operation for precharging the bit lines can be performed at high speeds with high accuracy.

Another semiconductor memory device according to the present invention includes a plurality of memory cells, bit line pairs to which the memory cells are connected, a plurality of precharge circuits for precharging the bit line pairs to a first voltage that is different from a mean value between a high level and a low level, in accordance with a first control signal, a bit line precharge power line for supplying the first voltage for precharging to the precharge circuits, a plurality of capacitor circuits; and a first control circuit for controlling the capacitor circuits. Each capacitor circuit includes a first capacitor, a charging circuit for charging the first capacitor, and a transfer gate circuit for controlling connection and disconnection between the first capacitor and the bit line precharge power lines. The first control circuit, in accordance with a third control signal for controlling the number of bit line pairs that are simultaneously activated, changes the number of the plurality of capacitor circuits that are activated, and only in a capacitor circuit that is activated, the transfer gate circuit is controlled in accordance with a second control signal so that the first capacitor and the bit line precharge power line are connected during precharging of the bit line pairs.

According to this configuration, in a semiconductor memory device in which the active block can be changed by the second control signal, the bit lines can be precharged quickly regardless of the size of the active block, and a source for supplying an optimal voltage for precharging can be provided.

DESCRIPTION OF THE PREFERRED EMBODIMENTS

Embodiment 1

Figure 1:
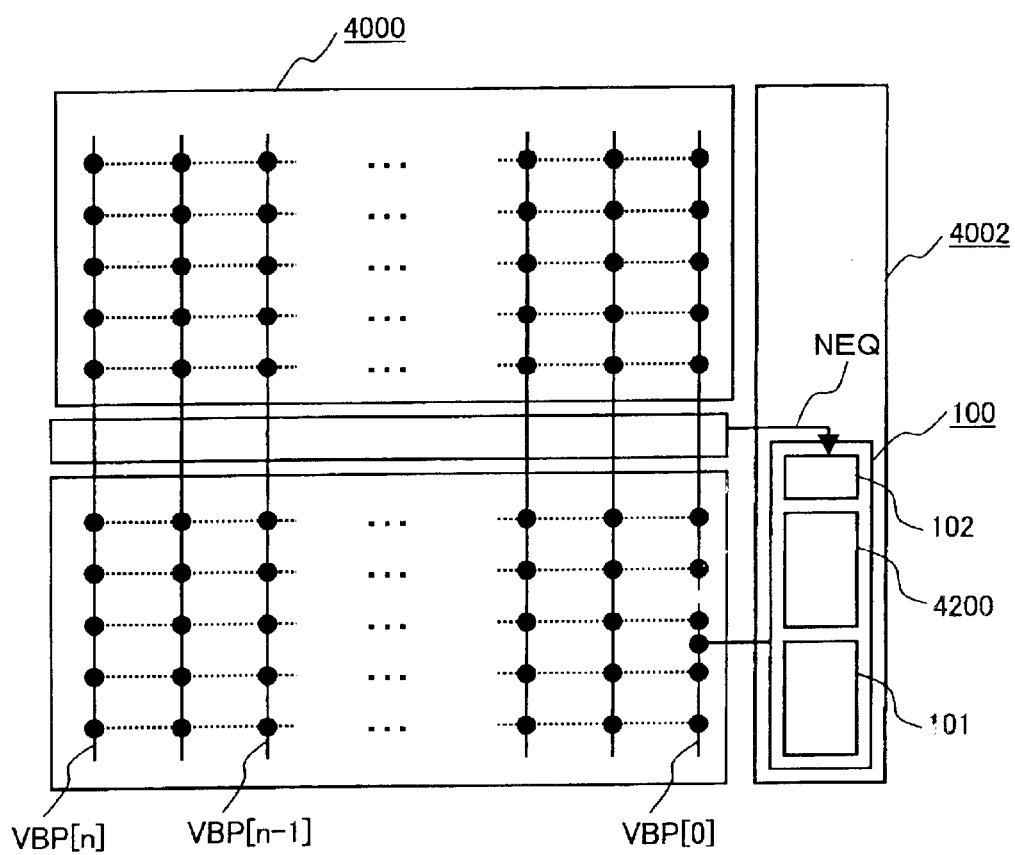
FIG. 1 is a circuit block diagram of a semiconductor memory device according to Embodiment 1 of the present invention.
Figure 19:
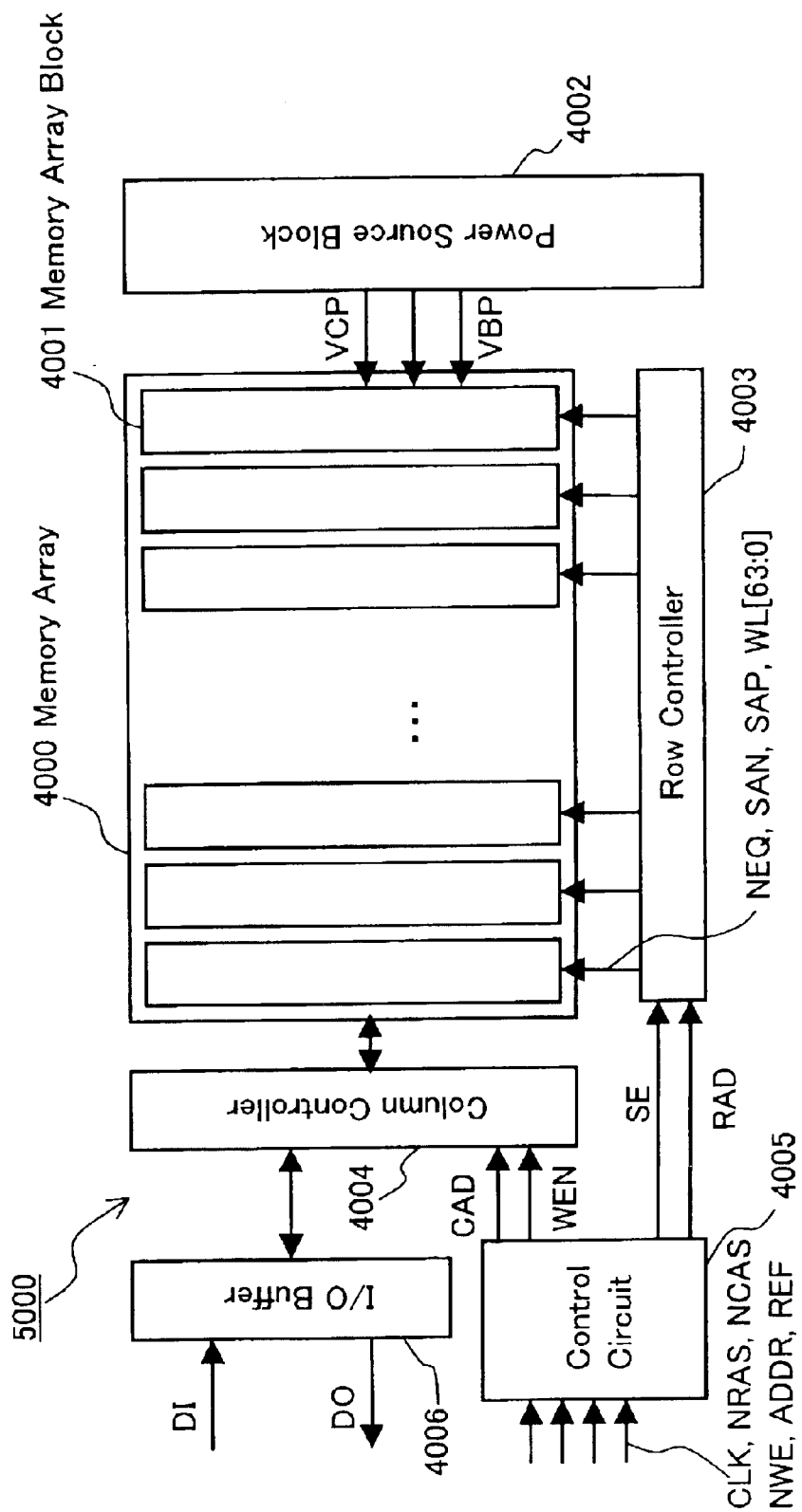
FIG. 19 is a function block diagram of a conventional, ordinary DRAM.
Figure 20:
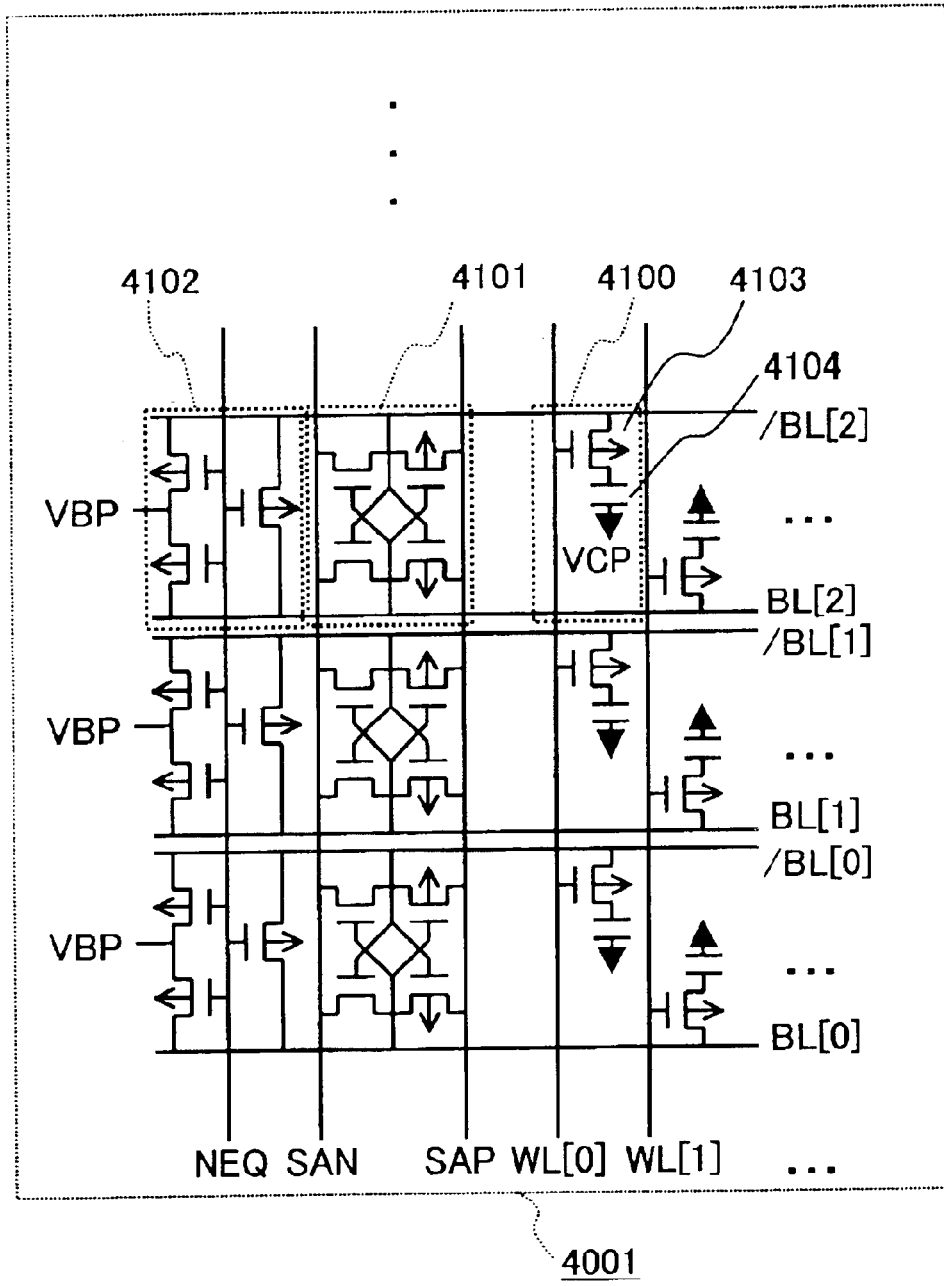
FIG. 20 is a circuit diagram of a conventional memory array block.
Figure 21:
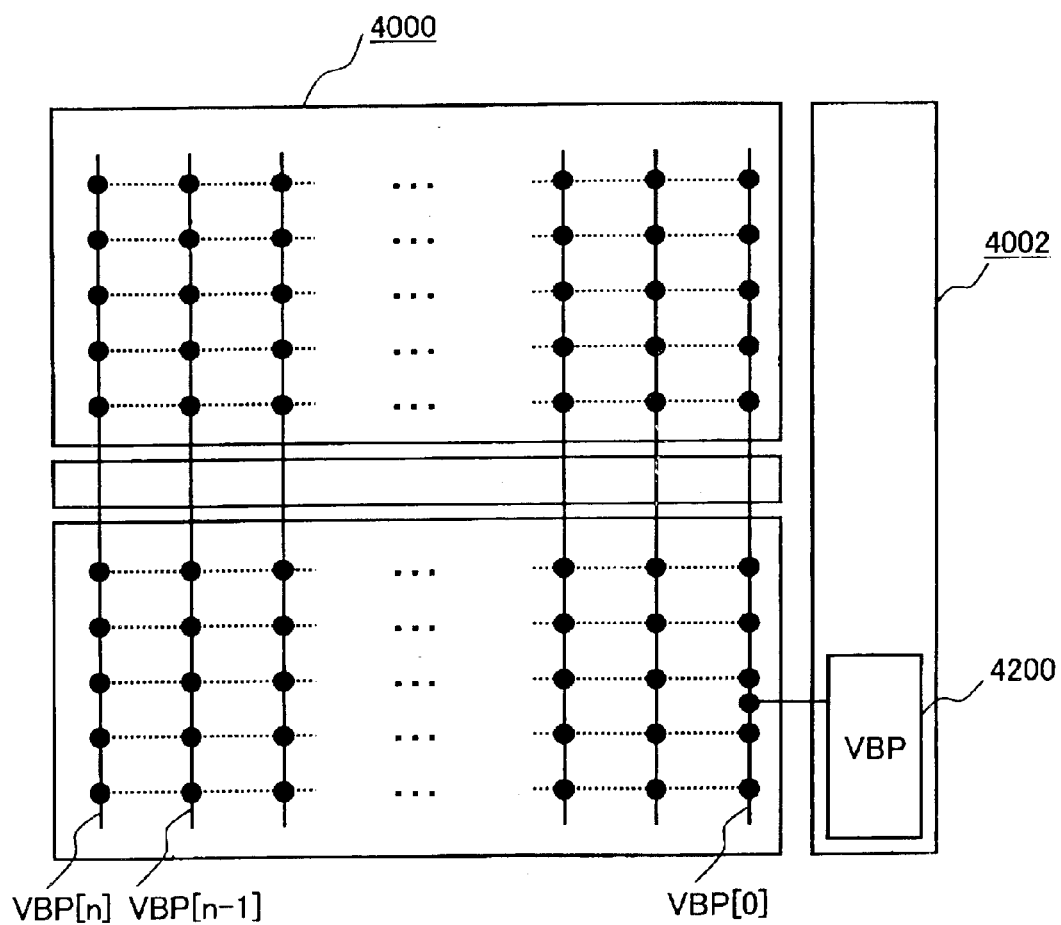
FIG. 21 is a diagram showing a conventional power source wiring network for the bit line precharge voltage.
Figure 22:
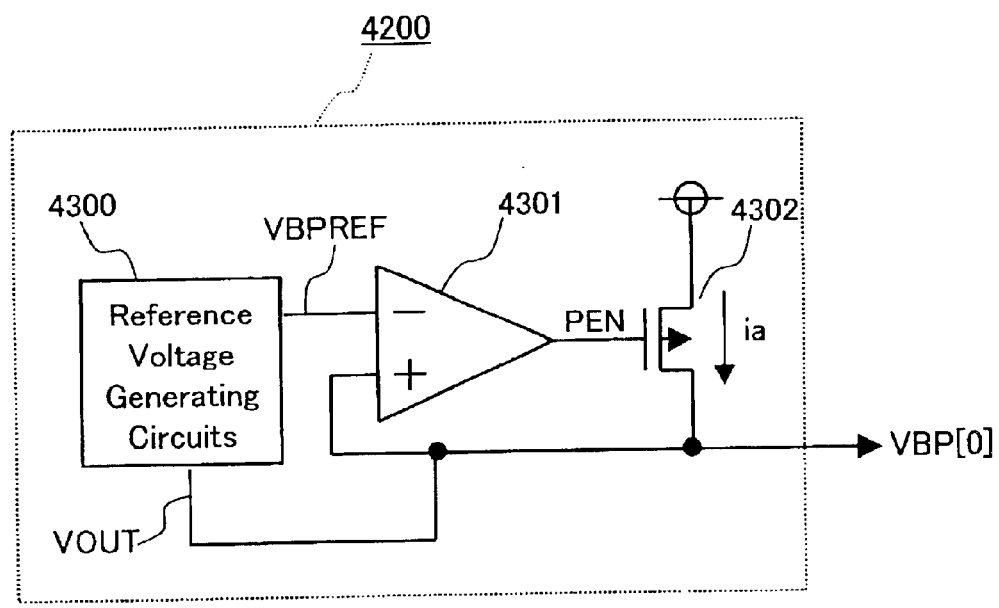
FIG. 22 is a circuit diagram of a conventional precharge voltage generating circuit.
Figure 23:
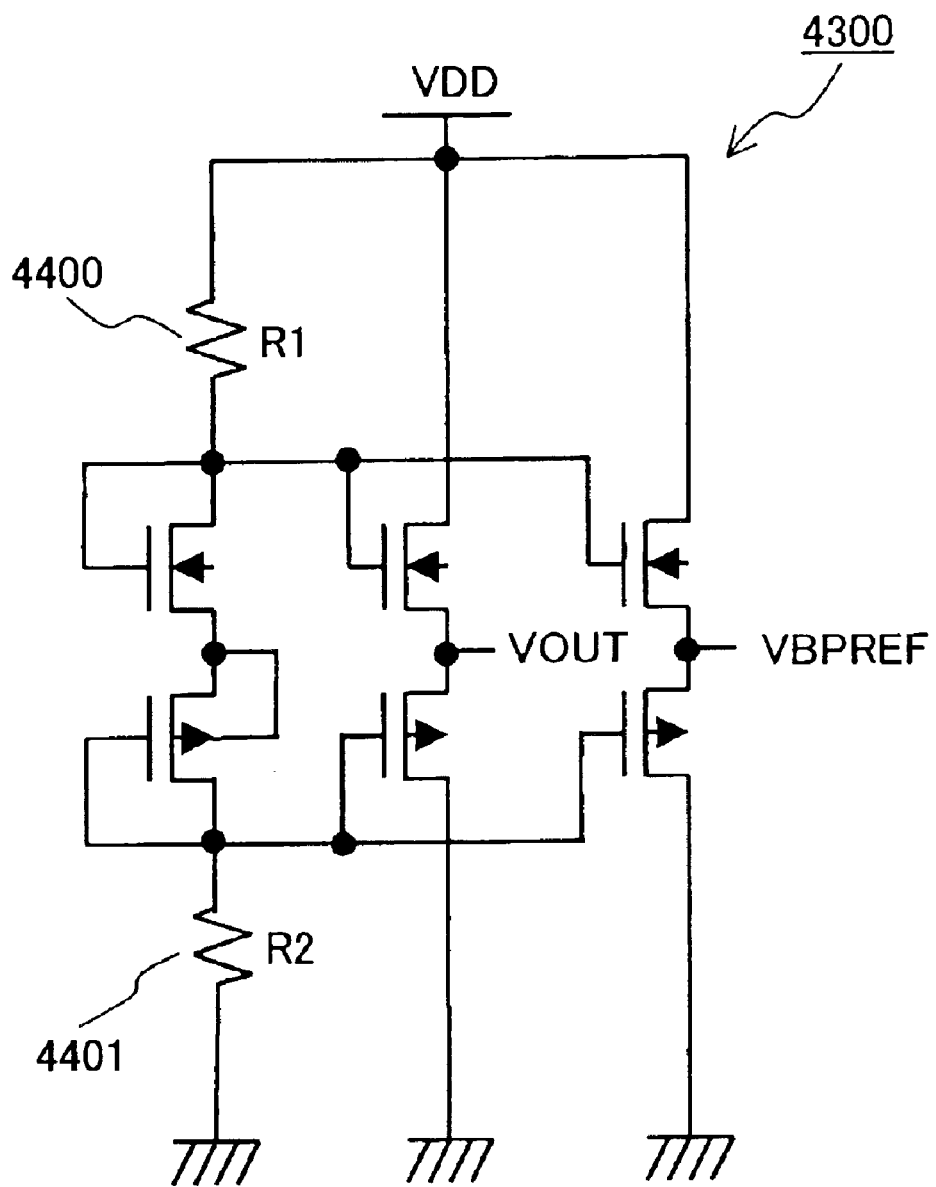
FIG. 23 is a circuit diagram of a conventional reference voltage generating circuit.
Figure 24:
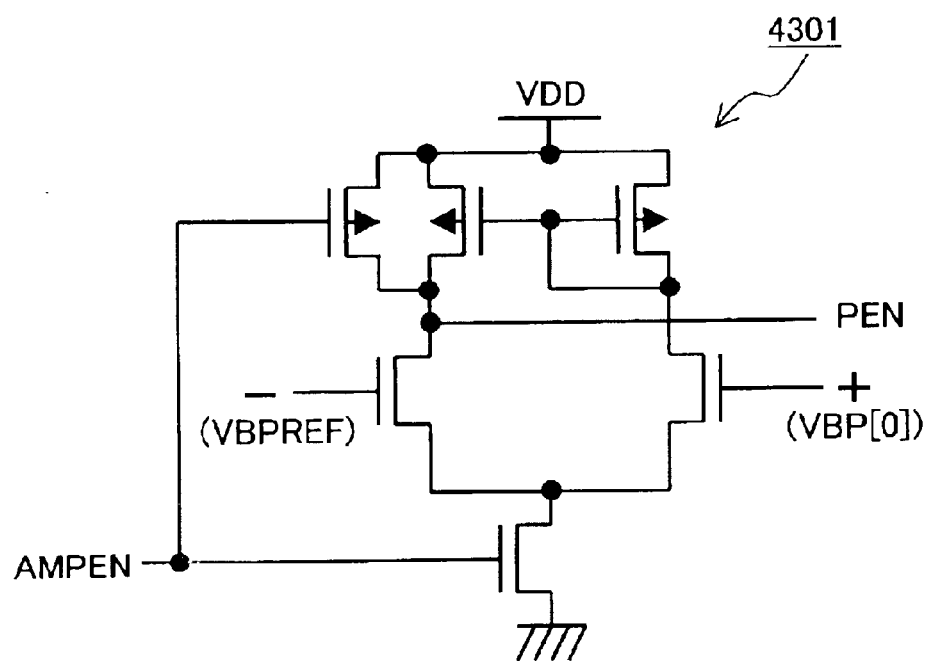
FIG. 24 is a circuit diagram of a conventional operational amplifier.

FIG. 1 shows a circuit block diagram of a semiconductor memory device in which a bit line precharge voltage generating device according to Embodiment 1 of the present invention is installed. The memory array 4000, the power source block 4002, the precharge voltage generating circuit 4200, and the bit line precharge power lines VBP[n] have the same configuration as in the conventional example. The function block configuration of the semiconductor memory device is the same as in the conventional configuration shown in FIG. 19. The circuit configuration of the memory array blocks 4001 (see FIG. 19) making up the memory array 4000 is the same as in the conventional configuration shown in FIG. 20.

The element that has been improved is a bit line precharge voltage generating device (a bit line precharge voltage generator circuit block) 100. The bit line precharge voltage generating device 100 includes a charge tank circuit 101 and a charge/discharge control circuit 102 in addition to the precharge voltage generating circuit 4200, which has the same configuration as in the conventional example. The bit line precharge voltage generating device 100 is connected to the bit line precharge power line VBP[0], which is the closest of the bit line precharge power lines VBP[n].

Figure 2:
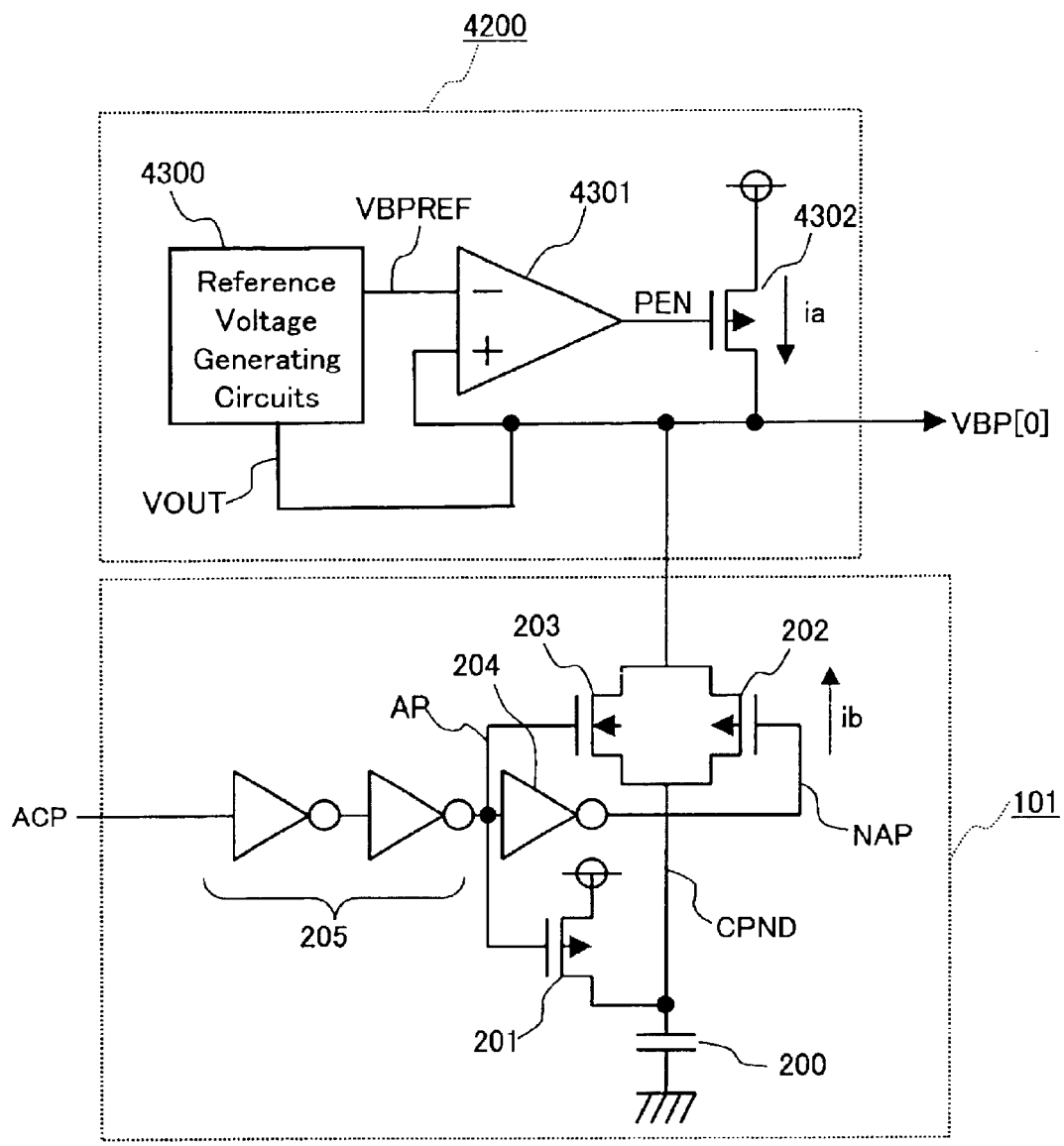
FIG. 2 is a circuit diagram of a precharge voltage generating circuit and a charge tank circuit according to Embodiment 1.

FIG. 2 shows circuit diagrams of the precharge voltage generating circuit 4200 and the charge tank circuit 101. The charge tank circuit 101 is made of a first capacitor 200, a first p-channel transistor 201, a second p-channel transistor 202, a first n-channel transistor 203, a first inverter 204, and a buffer inverter 205. CPND denotes a charge accumulation node, and AP, NAP, and ACP denote transfer gate connection signals. The circuit configuration of the precharge voltage generating circuit 4200 is like that of the conventional example.

The first terminal of the first capacitor 200 is connected to the drains of the first p-channel transistor 201, the second p-channel transistor 202, and the first n-channel transistor 203, and the other terminal of the first capacitor 200 is grounded. The capacitance Ccap of the first capacitor 200 should be large enough to store (VBPREF−½VDD)×Cb1, which is equivalent to the charge necessary for charging the potential of the bit lines BL[n], /BL[n] to the bit line precharge reference voltage VBPREF, when the total capacitance of the simultaneously precharged bit lines BL[n], /BL[n] is set to Cb1. Taking into account the amount of charge that is supplied by the operational amplifier 4301 during operation, a capacitance Ccap<(VBPREF−½VDD)/(VDD−VBPREF)×Cb1 is used.

The transfer gate connection signal AP is input at the gate of the first p-channel transistor 201, whose source is connected to an outside power source VDD. The second p-channel transistor 202 receives the transfer gate connection signal NAP at its gate, and the source of the second p-channel transistor 202 is connected to the bit line precharge power line VBP[0]. The transfer gate connection signal AP is received at the gate of the first n-channel transistor 203, and the source of the first n-channel transistor 203 is connected to the bit line precharge power line VBP[0]. The transfer gate connection signal AP is supplied to the input of the first inverter 204, and the output of the first inverter 204 constitutes the transfer gate connection signal AP. The buffer inverter 205 is made of an even number of inverter stages connected in series. The transfer gate connection signal ACP is supplied to the input of the buffer inverter 205, and the output of the buffer inverter 205 constitutes the transfer gate connection signal AP.

Figure 3:
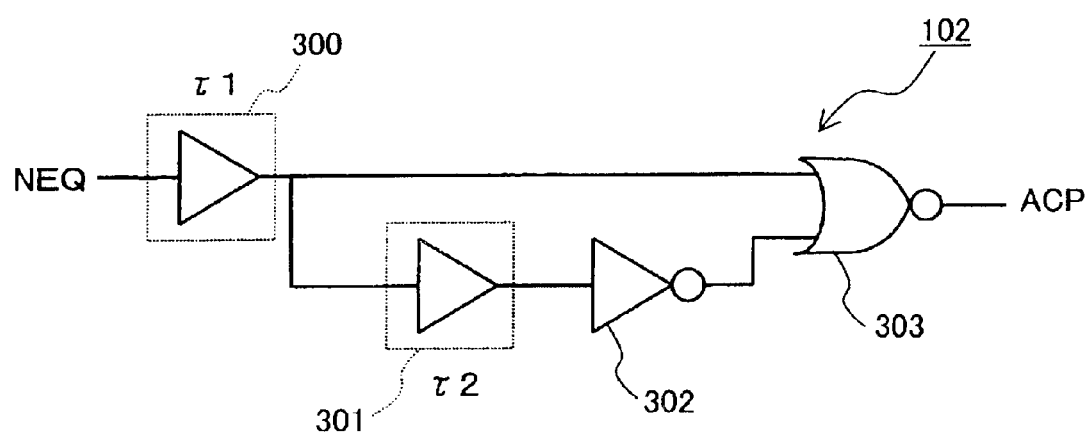
FIG. 3 is a circuit diagram of a charge/discharge control circuit according to Embodiment 1.

FIG. 3 is a circuit diagram of the charge/discharge control circuit 102. Numeral 300 denotes a first delay element, 301 denotes a second delay element, 302 denotes a second inverter, and 303 denotes a first NOR element. The delay time of the first delay element 300 is τ1. The input of the first delay element 300 is the bit line precharge signal NEQ, and the output of the first delay element 300 is received as input by the second delay element 301 and the first NOR element 303. The delay time of the second delay element 301 is τ2, and its output is connected to the input of the second inverter 302. The output of the second inverter 302 is received as input by the first NOR element 303, and the output of the first NOR element 303 is the transfer gate connection signal ACP.

Figure 4:
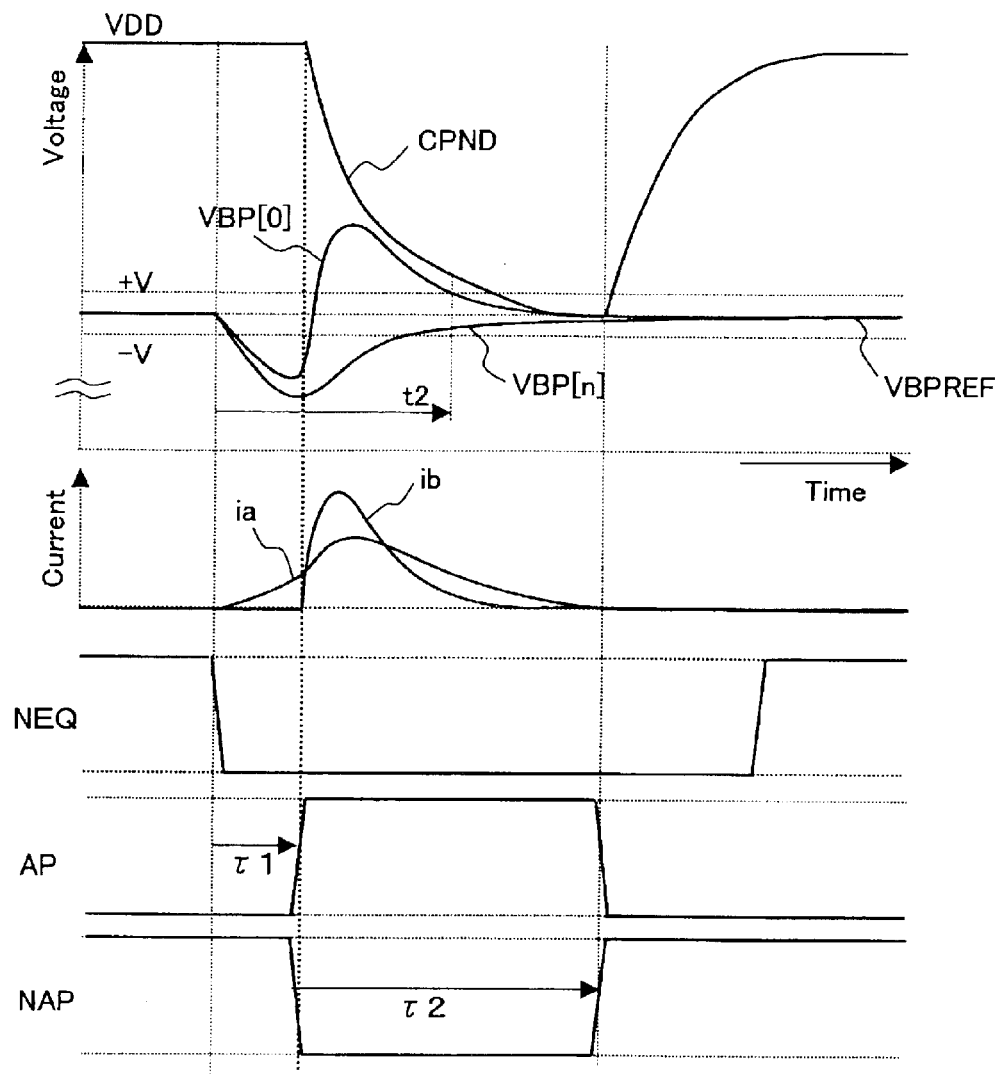
FIG. 4 shows an operation timing and a voltage of a primary node during precharge operation according to Embodiment 1.
Figure 25:
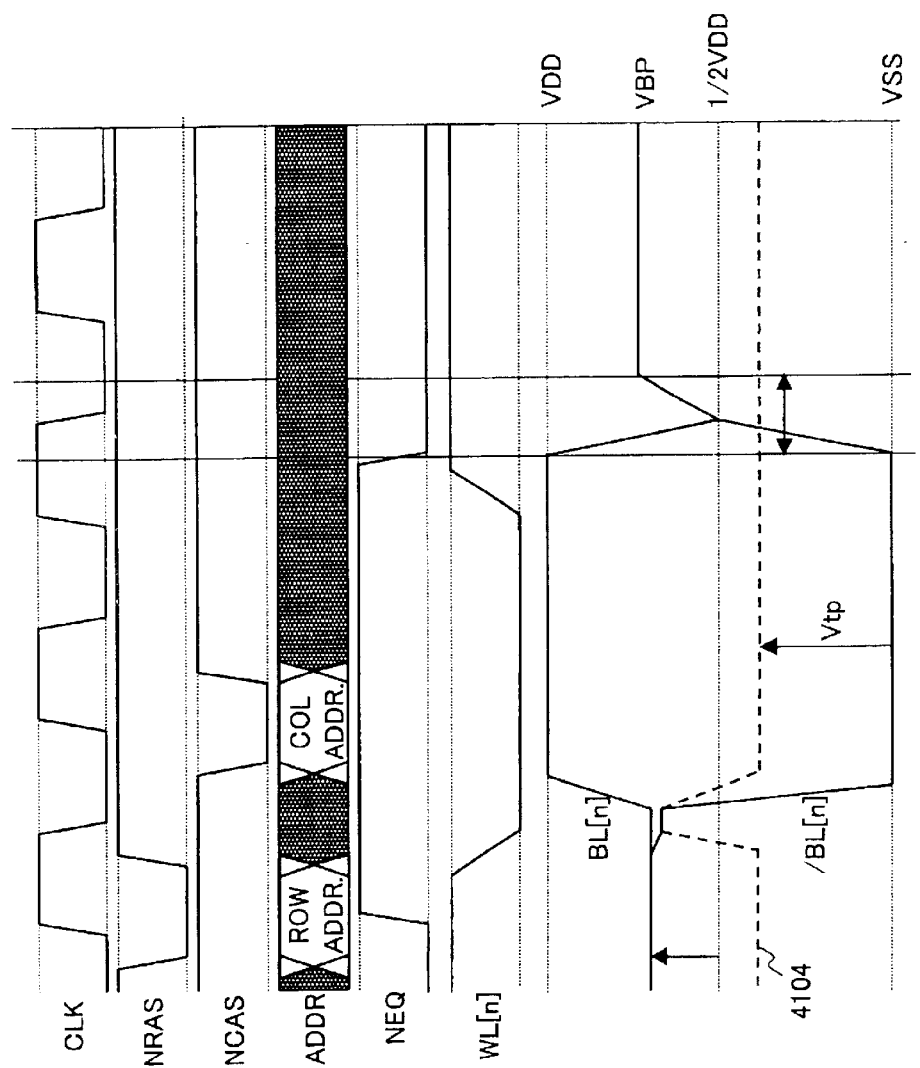
FIG. 25 is a timing diagram of an operation timing and an internal voltage timing of a conventional DRAM.
Figure 26:
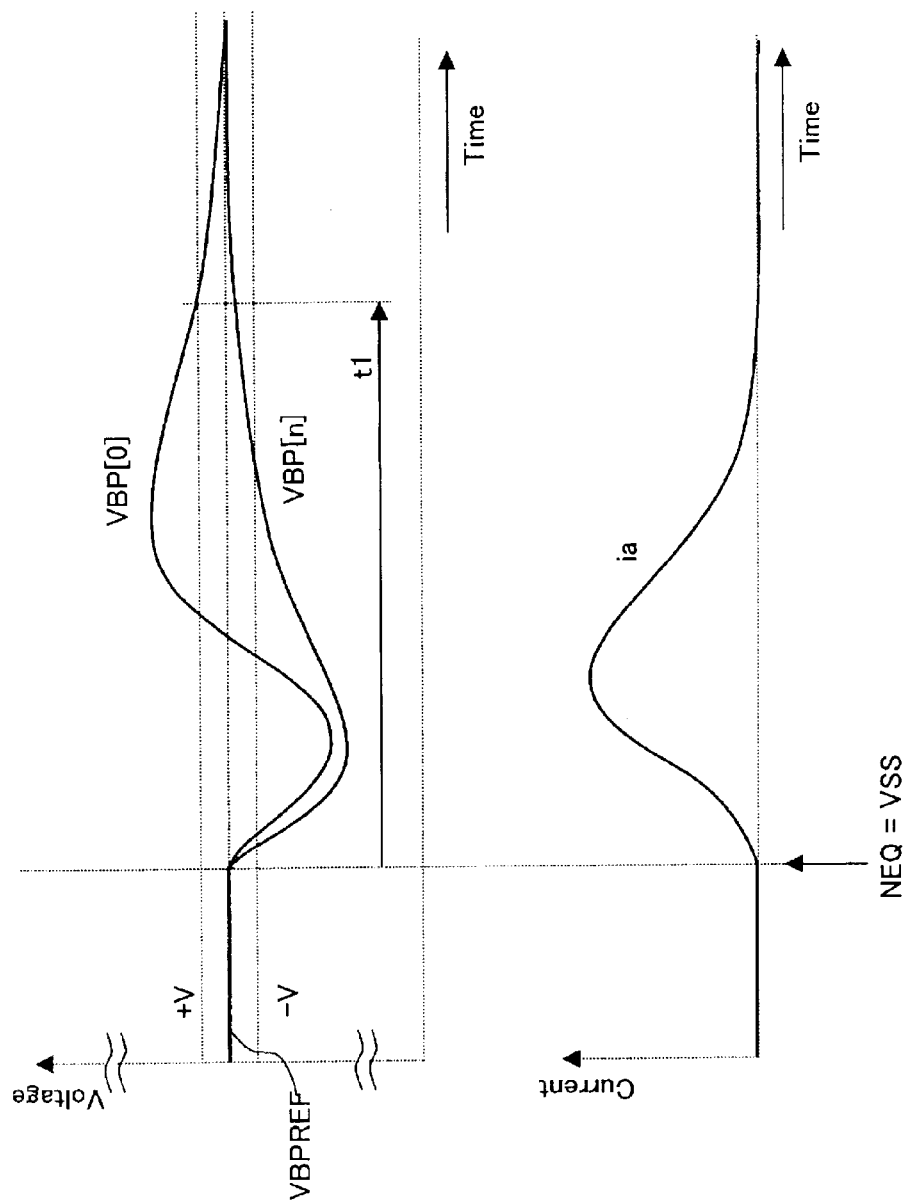
FIG. 26 is a diagram showing a conventional voltage of bit line precharge power lines and current during activation of a precharge circuit.

FIG. 4 shows the operation timing and the voltage of the primary node during the precharge operation of the bit line precharge voltage generating device 100. The operation is described below with reference to this drawing. The operation timing of the semiconductor memory device in which the bit line precharge voltage generating device according to the present invention is mounted is the same as that shown in FIG. 25.

When the bit line precharge signal NEQ is set to a low level and the precharge circuit 4102 (see FIG. 20) is activated, the potentials of the bit lines BL[n], /BL[n], which are set to potentials of VDD and VSS, are equalized by the sense amplifier 4101 and are charged to a potential of ½ VDD. The precharge circuit 4102 at the same time connects the bit lines BL[n], /BL[n] to the corresponding bit line precharge power line VBP[n] and charges the bit lines to the bit line precharge voltage VBP. At this time, current is consumed and a voltage drop occurs.

When a voltage drop occurs in the bit line precharge power line VBP[n], the voltage drop is transmitted to the bit line precharge power line VBP[0] via wiring connected in a lattice. This is detected and the operational amplifier 4301 is activated, and it takes time before the current ia flowing through the p-channel transistor 4302 becomes large.

If the bit line precharge signal NEQ is at a high level, then the transfer gate connection signal AP is at a low level and the second p-channel transistor 202 and the first n-channel transistor 203 are off, the first p-channel transistor 201 is on, and the charge accumulation node CPND is charged to a high level so that a charge builds up in the first capacitor 200.

When the bit line precharge signal NEQ become low level, after the delay time τ1 determined by the first delay element 300, the transfer gate connection signal AP become high level, the first p-channel transistor 201 is turned off, and the second p-channel transistor 202 and the first n-channel transistor 203 are turned on. Thus, the first capacitor 200 and the bit line precharge power line VBP[0] are electrically connected to one another and the current ib is allowed to flow. The current accumulation node CPND is connected to the high level, and due to the current ib, the voltage level of the bit line precharge power line VBP[0] is increased rapidly.

In response to the rise in the voltage level, the operational amplifier 4301 changes the operation of the p-channel transistor 4302 toward off, and it takes time before the flowing current ia becomes small.

Then, after the delay time τ2 that is determined by the second delay element 301, the transfer gate connection signal AP is at a low level, the second p-channel transistor 202 and the first n-channel transistor 203 are off, and the first p-channel transistor 201 is on so that the charge accumulation node CPND is charged to a high level in preparation for the next precharge operation.

As explained hereinabove, according to this embodiment, a function has been added for releasing the charge stored in the first capacitor 200 to the operational amplifier 4301, which experiences a delay in operation, when the bit lines BL[n], /BL[n] are precharged to the high level, so that the precharge operation can be ended quickly and the semiconductor memory device can operate at high speed.

Embodiment 2

Figure 5:
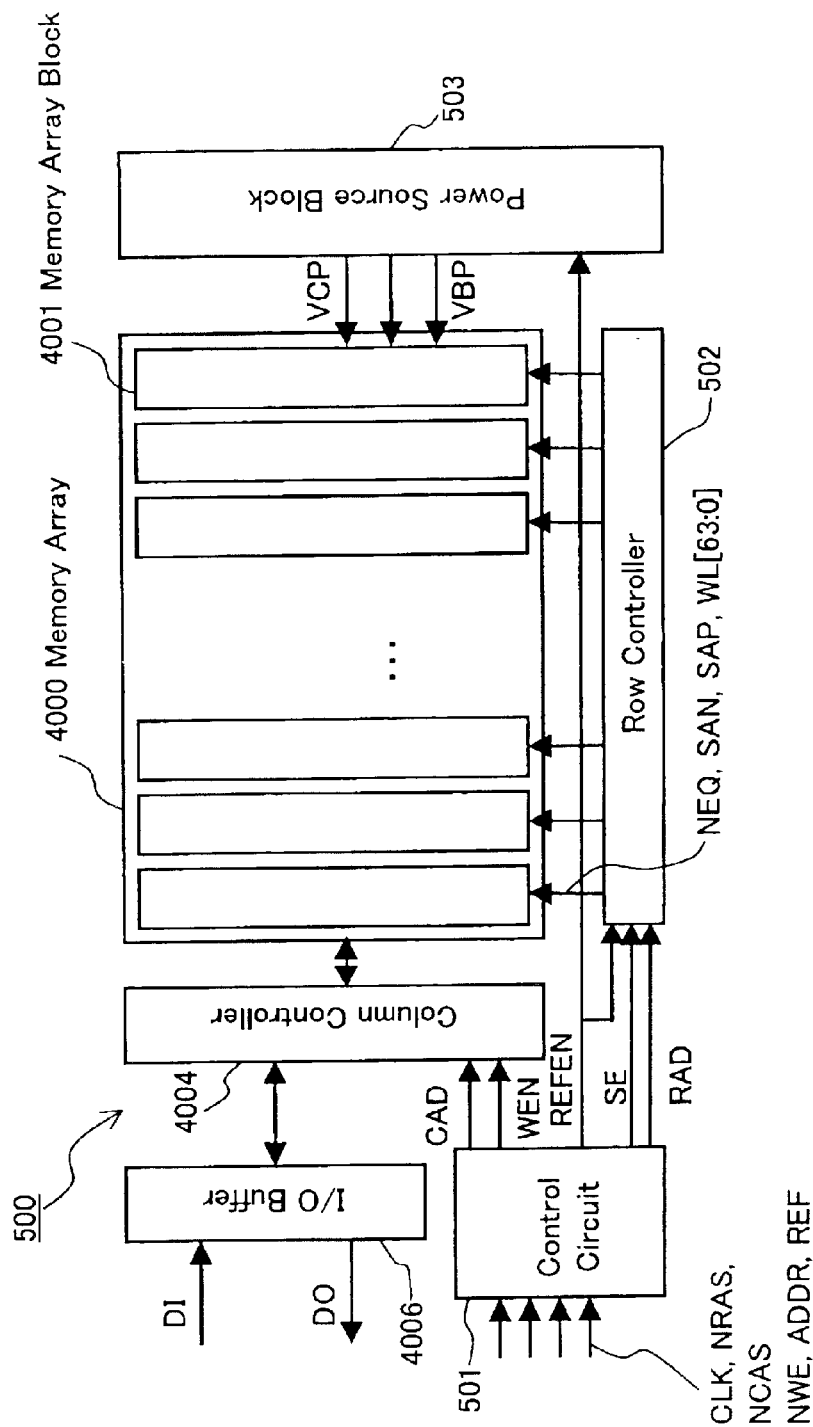
FIG. 5 is a function block diagram of a semiconductor memory device according to Embodiment 2.

FIG. 5 shows a function block diagram of a semiconductor memory device 500 in which a bit line precharge voltage generating device is installed according to Embodiment 2 of the present invention. Elements similar to those of the conventional semiconductor memory device that already have been explained are assigned identical reference numerals and a further description thereof is omitted. The elements to which changes have been made are a control circuit 501, a row controller 502, and a power source block 503. REFEN is a refresh operation enable signal. In the following description, primary emphasis is given to items that are different from those appearing in the conventional configuration.

The control circuit 501 receives as input the outside clock signal CLK, the row address strobe signal NRAS, the column address strobe signal NCAS, the write control signal NWE, the address ADDR, and the refresh control signal REF. The refresh operation enable signal REFEN that is output from the control circuit 501 is input to the row controller 502 and the power source block 503.

Figure 6A:
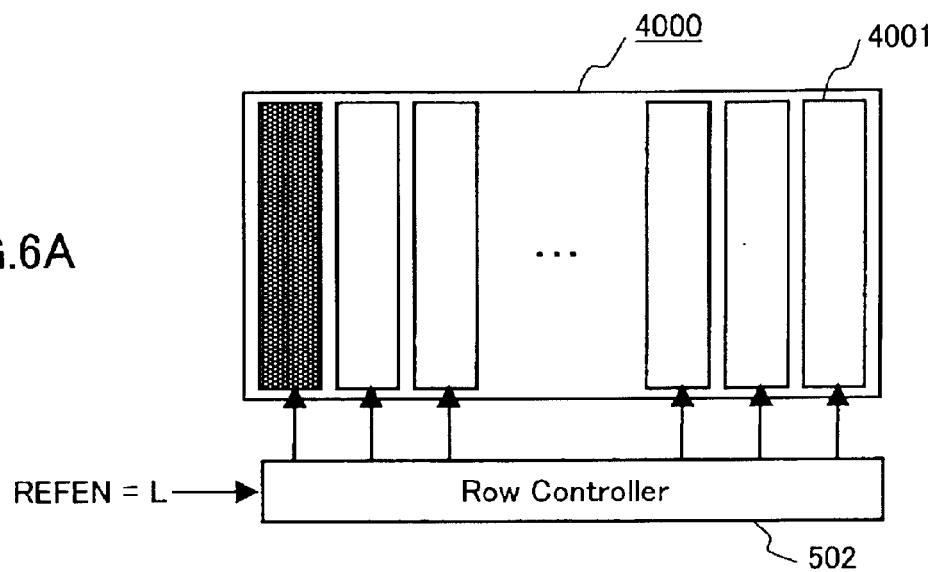
FIGS. 6A and 6B are structural diagrams showing memory array blocks that are activated during normal operation and during refresh operation of the semiconductor memory device according to Embodiment 2.
Figure 6B:
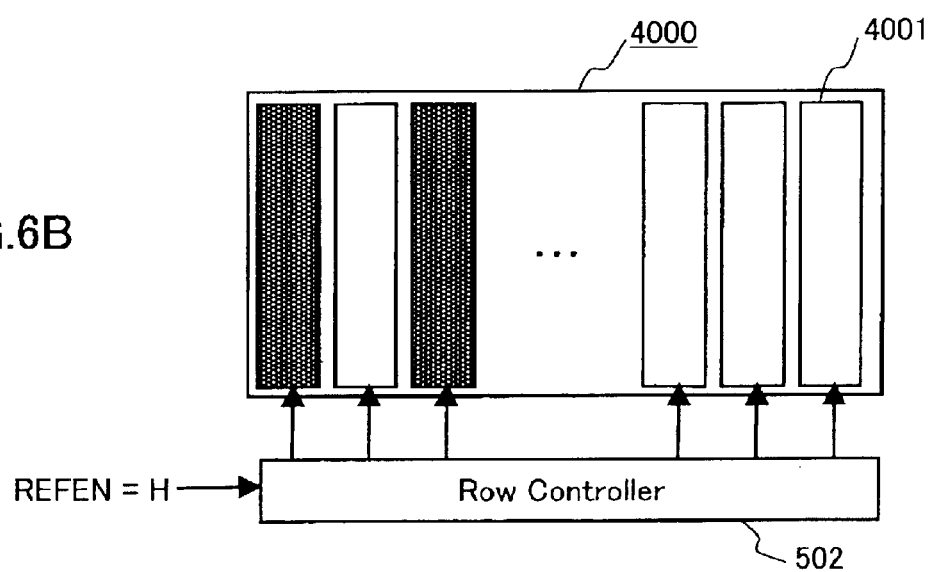

FIGS. 6A and 6B show the conditions of the active memory array blocks 4001 during normal operation and during the refresh operation, respectively, of a semiconductor memory device to which the bit line precharge voltage generating device according to this embodiment has been installed. When the refresh operation enable signal REFEN is at a low level, the semiconductor memory device is in normal operation, and as shown in FIG. 6A, the bit line precharge signal NEQ, the sense amplifier activation signals SAN and SAP, and the word line drive signal WL[63:0] are output from the row controller 502 to a single memory array block 4001. When the refresh operation enable signal REFEN is at a high level, the semiconductor memory device is in refresh operation, and as shown in FIG. 6B, the bit line precharge signal NEQ, the sense amplifier activation signals SAN and SAP, and the word line drive signal WL[63:0] are output from the row controller 502 to a plurality of memory array blocks 4001.

Figure 7:
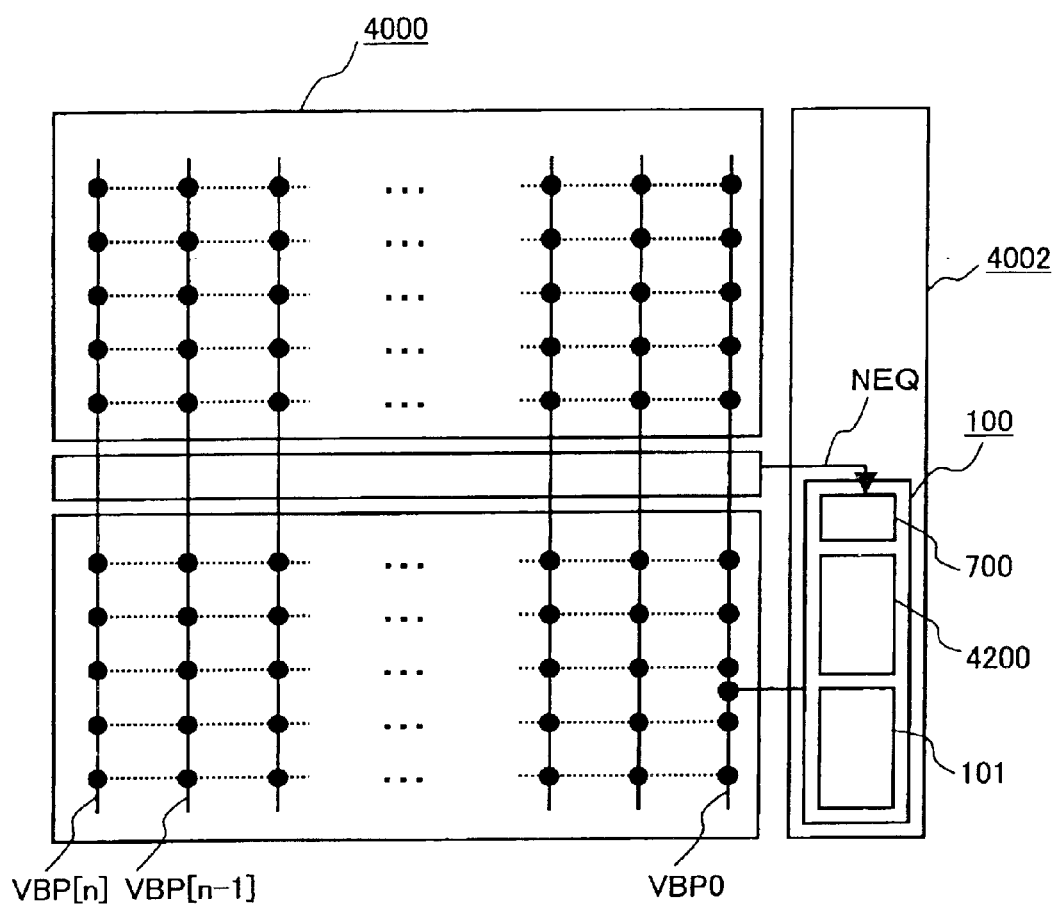
FIG. 7 is a circuit block diagram of the semiconductor memory device according to Embodiment 2.

FIG. 7 shows a circuit block diagram of the semiconductor memory device according to this embodiment. The memory array 4000, the power source block 4002, the precharge voltage generating circuit 4200, and the bit line precharge power lines VBP[n] have the same configurations as in the conventional example. Also, the circuit configuration of the memory array block 4001 is the same as in the conventional configuration shown in FIG. 20. Elements assigned reference numerals that are identical to those in Embodiment 1 have identical structures. Numeral 700 denotes a charge/discharge control circuit.

The configuration of this embodiment differs from that of Embodiment 1 in that the structure of the charge/discharge control circuit 700 is different and in that the capacitance Ccap of the first capacitor 200 that is arranged in the charge tank circuit 101 (see FIG. 2) is optimized in accordance with the total capacitance of the bit line pair activated during the refresh operation, and is large.

Figure 8:
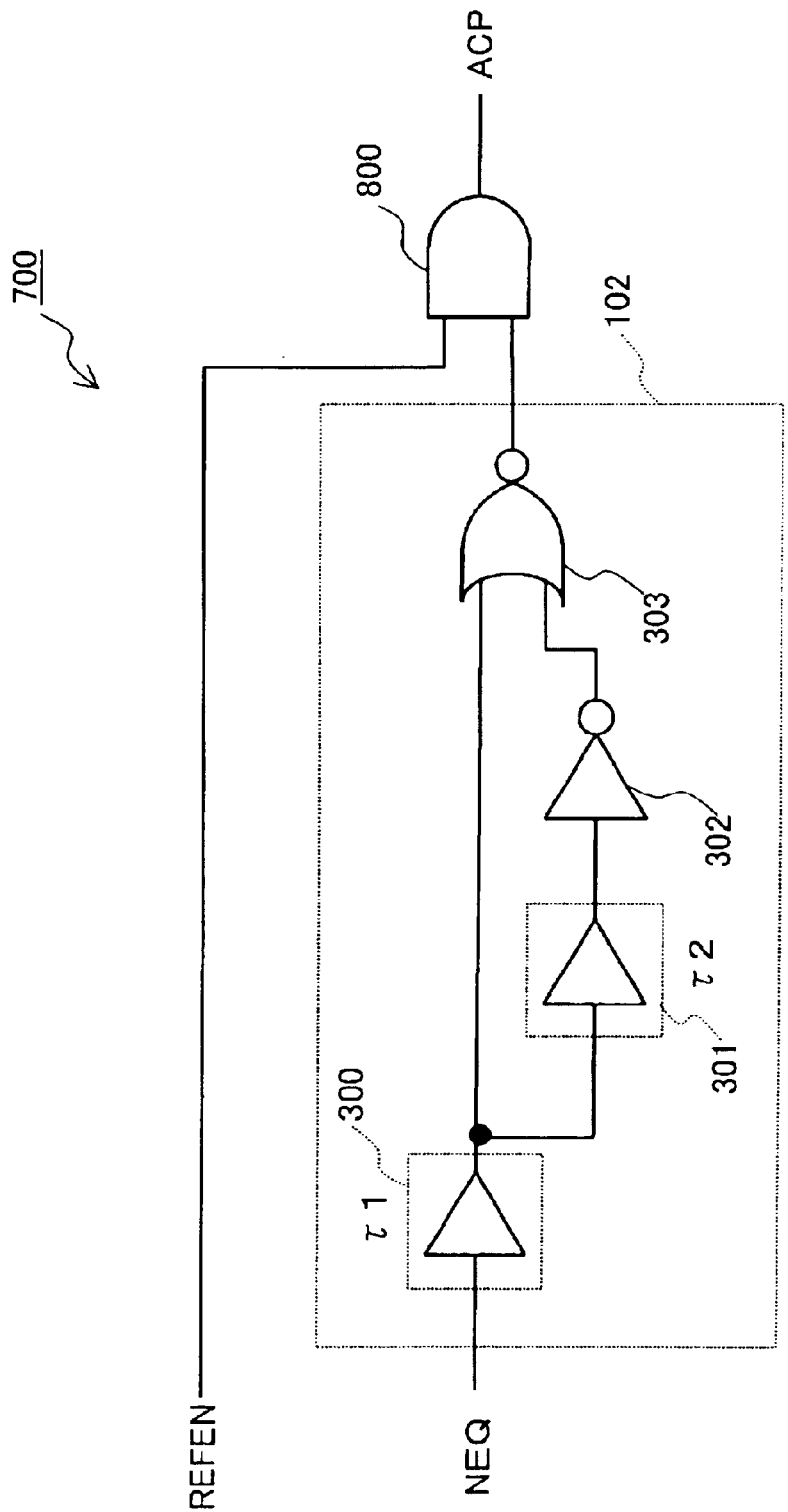
FIG. 8 is a circuit diagram of a charge/discharge control circuit according to Embodiment 2.

FIG. 8 shows a circuit diagram of the charge/discharge control circuit 700 according to this embodiment. Numeral 102 indicates a circuit configuration block that is identical to the charge/discharge control circuit of Embodiment 1, and 800 denotes a first AND element. The output of the charge/discharge control circuit 102 according to Embodiment 1 is input to the first AND element 800. The refresh operation enable signal REFEN is received at the other input of the first AND element 800. The output of the first AND element 800 is the transfer gate connection signal ACP.

Figure 9:
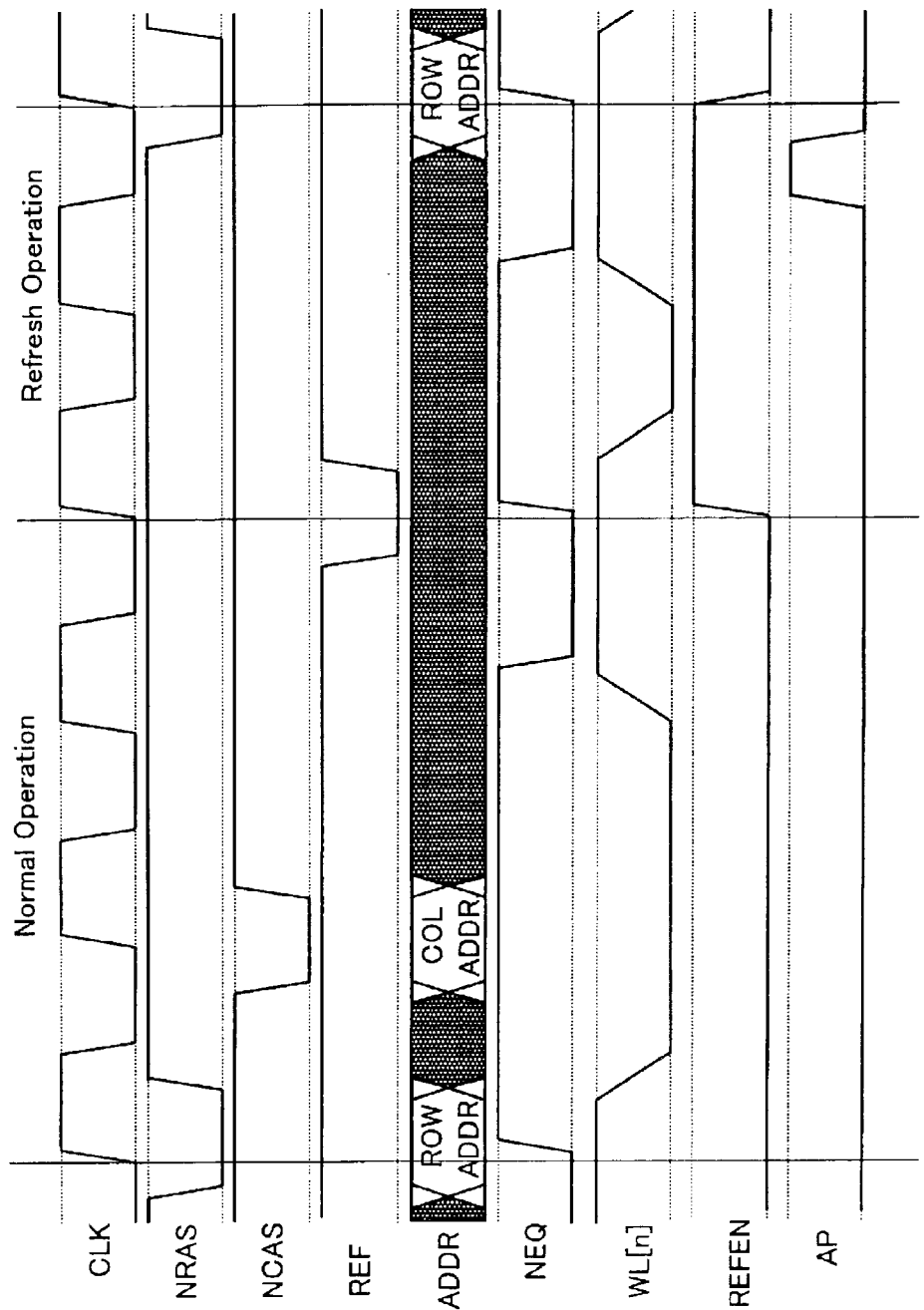
FIG. 9 is a diagram showing the timing of the normal operation and the timing of the refresh operation of the semiconductor memory device according to Embodiment 2.

FIG. 9 shows the timing of the semiconductor memory device according to this embodiment during normal operation and during the refresh operation.

Operations during normal operation are identical to those of Embodiment 1, and the refresh control signal REF is set to a high level. When the refresh control signal REF is set to a high level, the refresh operation enable signal REFEN is set to a low level. When the refresh operation enable signal REFEN is at a low level, the output of the charge/discharge control circuit 700, that is, the transfer gate connection signal ACP, which is output from the first AND element 800, become low level. Consequently, the transfer gate connection signal AP is held at a low level and the charge stored in the first capacitor 200 is not discharged.

When the refresh control signal REF is set to a low level at the rising edge of the outside clock signal CLK, the refresh operation enable signal REFEN become high level, and the bit line precharge signal NEQ connected to the plurality of memory array blocks 4001 corresponding to the row address that is determined by an internal refresh counter, for example, is set to a high level. After a predetermined period, the bit line precharge signal NEQ is set to a low level, at which time the transfer gate connection signal AP become high level. Accordingly, discharge of the charge that has accumulated in the first capacitor 200 is carried out, and the bit line precharge operation is performed quickly. Moreover, after the delay time τ2 determined by the second delay element 301, the transfer gate connection signal AP become low level and charge is accumulated in the first capacitor 200.

As detailed above, according to this embodiment, a function has been added for discharging the charge that has accumulated in the first capacitor 200 during the refresh operation, so that when a larger number of bit lines BL[n], /[BL]n than during normal operation are precharged to the high level, the precharge operation can be ended quickly and the precharge operation of the semiconductor memory device can be performed quickly.

Embodiment 3

Figure 10:
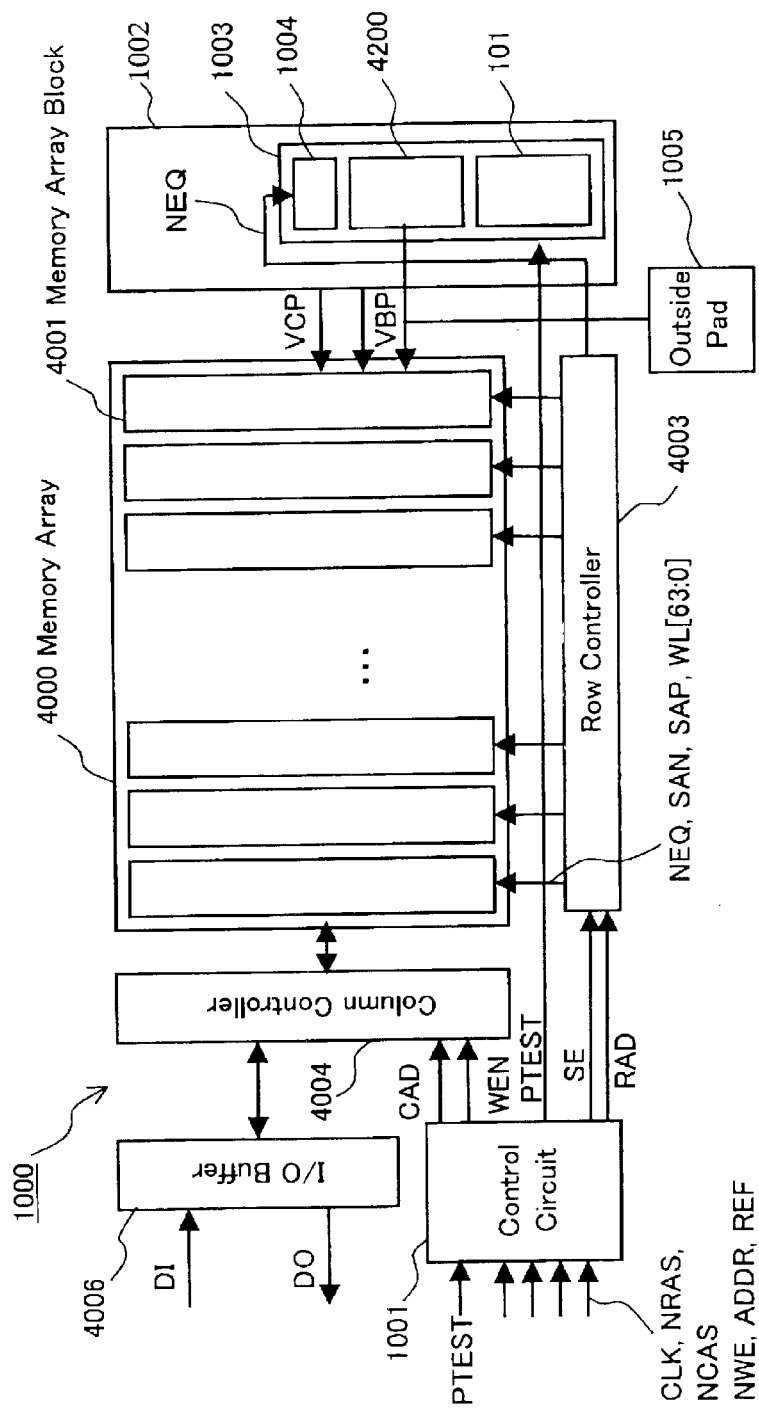
FIG. 10 is a circuit block diagram of a semiconductor memory device according to Embodiment 3.

FIG. 10 shows a circuit block diagram of a semiconductor memory device 1000 according to Embodiment 3 of the present invention. Elements that are assigned reference numerals identical to those in the conventional example or in Embodiment 1 have identical configurations. In the present embodiment, a bit line precharge power source test signal PTEST has been added. The elements that are different are a control circuit 1001, a power source block 1002, a bit line precharge voltage generating device 1003, a charge/discharge control circuit 1004, and an outside pad 1005.

The bit line precharge voltage generating device 1003 disposed in the power source block 1002 includes the charge/discharge control circuit 1004, the charge tank 101, and the precharge voltage generating circuit 4200. The bit line precharge power source test signal PTEST is input to the control circuit 1001 and the charge/discharge control circuit 1004. The outside pad 1005 is connected to the bit line precharge voltage VBP.

Figure 11:
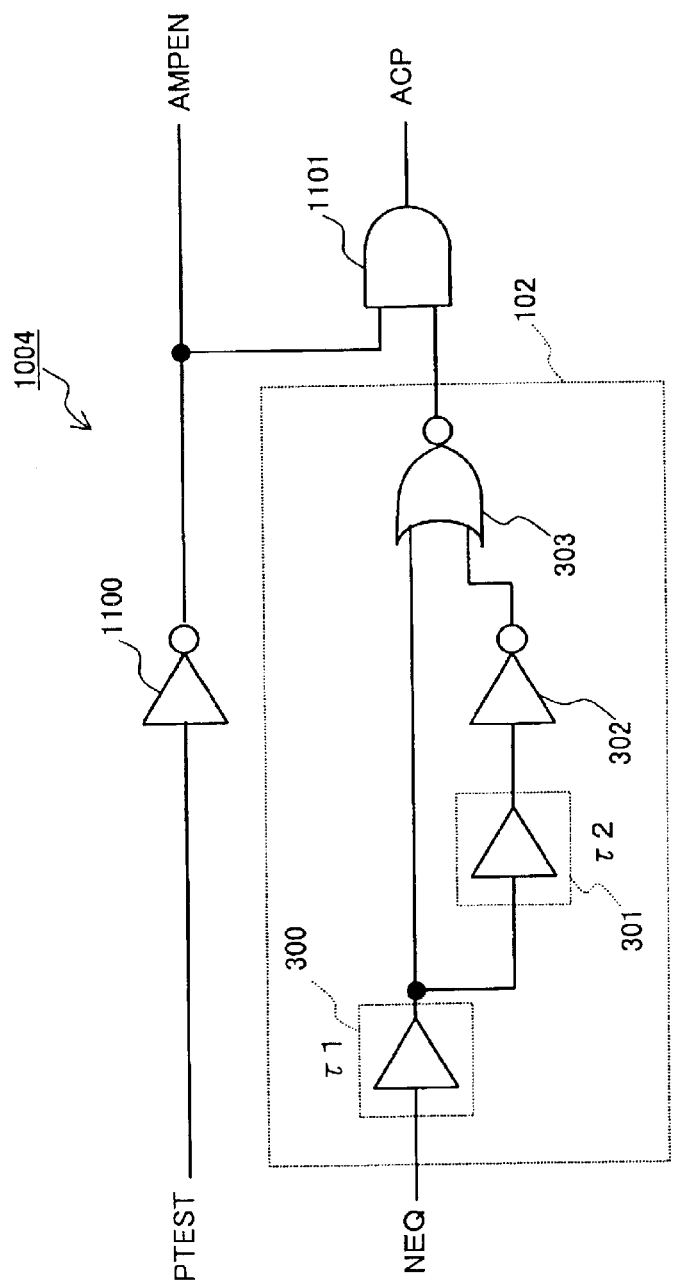
FIG. 11 is a circuit diagram of a charge/discharge control circuit according to Embodiment 3.

FIG. 11 shows a circuit diagram of the charge/discharge control circuit 1004. Numeral 102 is a charge/discharge control circuit like that of Embodiment 1, 1100 is a third inverter, and 1101 is a second AND element. The output of the charge/discharge control circuit 102 is input to the second AND element 1101, and the bit line precharge power source test signal PTEST is input to the third inverter 1100. The output of the third inverter 1100 is supplied as the differential amplifier control signal AMPEN and is also input to the second AND element 1101. The output of the second AND element 1101 is the transfer gate connection signal ACP.

The operation of the semiconductor memory device 1000 configured as above is described below. When the bit line precharge power source test signal PTEST is at a low level, the device is in normal operation, and an operation similar to that of Embodiment 1 can be carried out. When the bit line precharge power source test signal PTEST is at a high level, the differential amplifier control signal AMPEN is at a low level, the operational amplifier 4301 is stopped, the transfer gate connection signal ACP is fixed at a low level, and the supply of current to the bit line precharge voltage VBP is not performed.

As described above, according to the present embodiment, by setting the bit line precharge power source test signal PTEST to a high level, the supply of current to the bit line precharge voltage VBP is not carried out and an arbitrary voltage can be applied in a programming test, for example, from the outside pad 1005, so as to enable an evaluation of the operation margin, for example.

Embodiment 4

Figure 12:
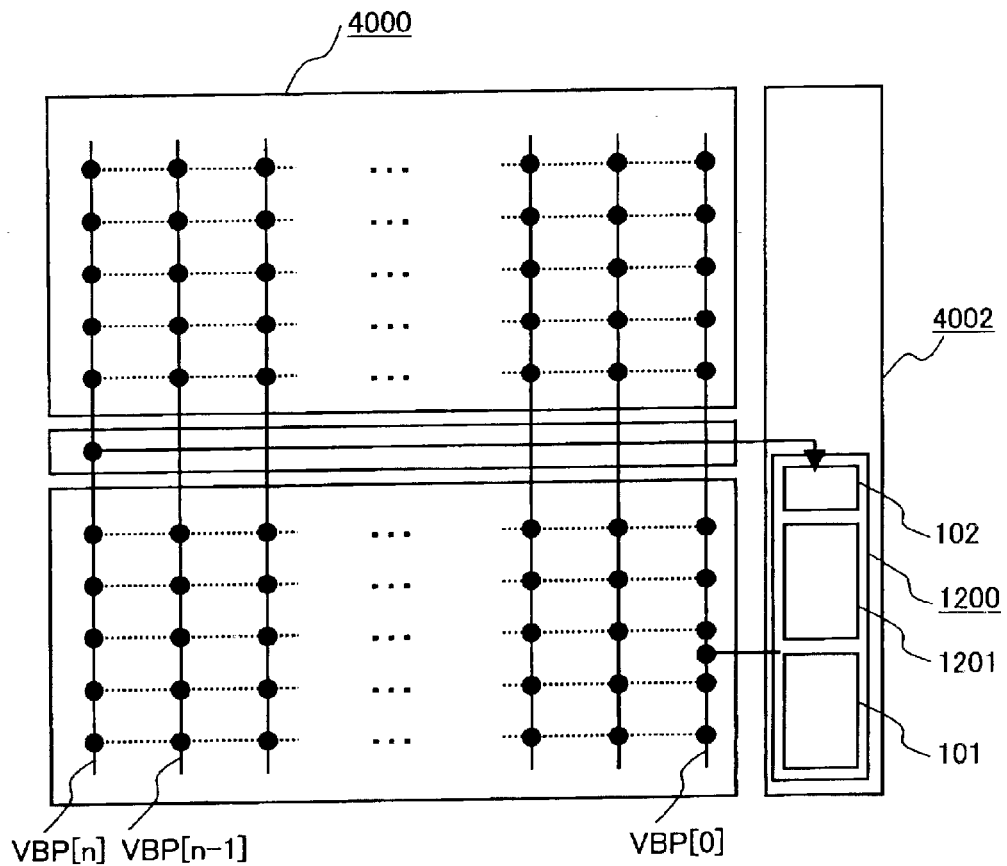
FIG. 12 is a circuit block diagram of a semiconductor memory device according to Embodiment 4.

FIG. 12 shows a circuit block diagram of a semiconductor memory device according to Embodiment 4 of the present invention. Elements that are assigned reference numerals identical to those in the conventional example or in Embodiment 1 have identical configurations. A bit line precharge voltage generating device 1200 includes a precharge voltage generating circuit 1201, the charge tank 101, and the charge/discharge control circuit 102. The bit line precharge voltage generating device 1200 is connected to the bit line precharge power line VBP[n].

Figure 13:
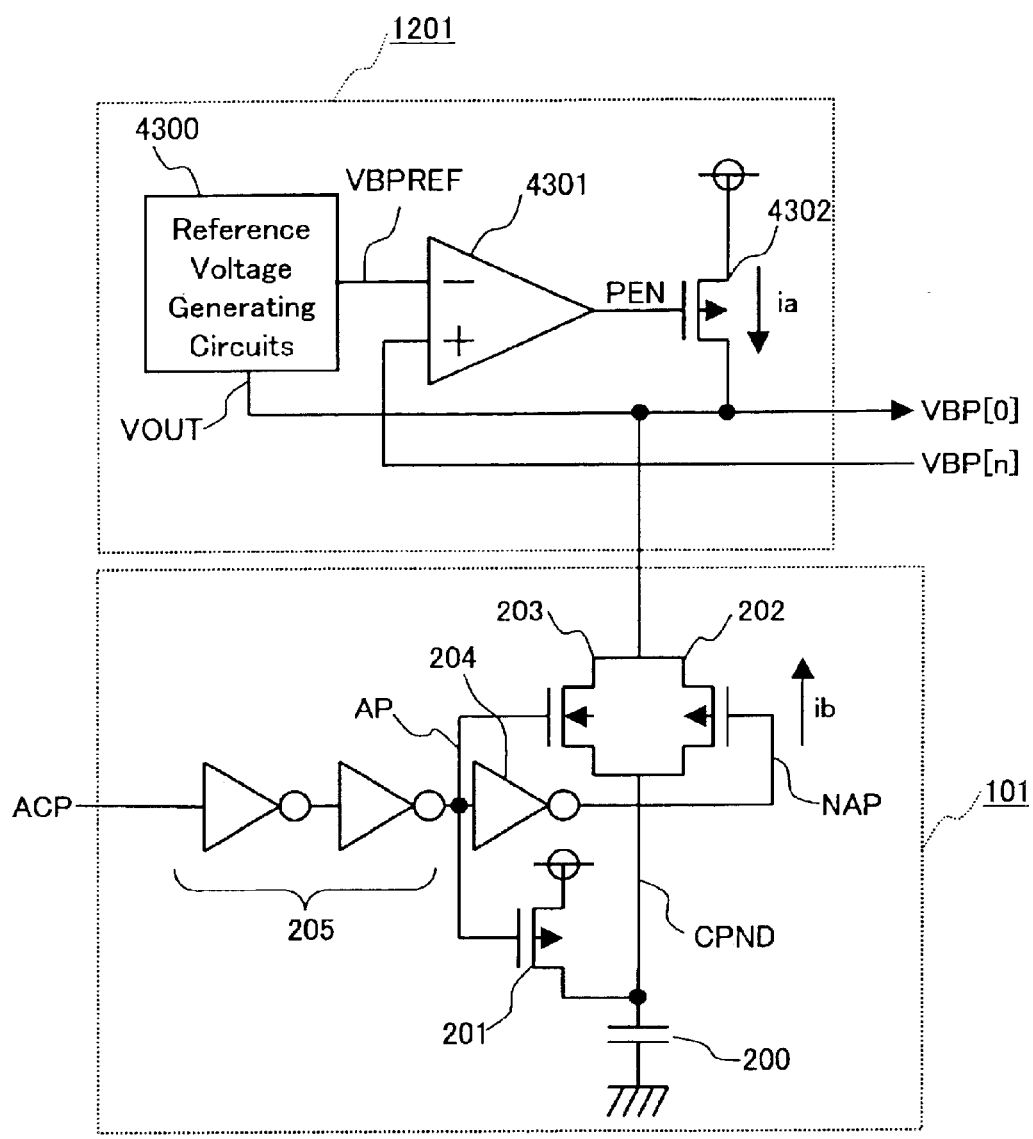
FIG. 13 is a circuit diagram of a precharge voltage generating circuit and a charge tank circuit according to Embodiment 4.

FIG. 13 shows a circuit diagram of the precharge voltage generating circuit 1201 and the charge tank 101 according to this embodiment. The circuit configuration of the charge tank 101 is identical to that of Embodiment 1. The precharge voltage generating circuit 1201 differs from the precharge voltage generating circuit 4200 of the conventional example in that, instead of the +input of the operational amplifier 4301 being connected to the bit line precharge power line VBP[0], it is connected to the bit line precharge power line VBP[n].

With the configuration described hereinabove, the precharge operation can be performed at high speeds without being affected by the impedance between the bit line precharge power line VBP[0] and the bit line precharge power line VBP[n], even if the memory array block 4001 that is connected to the bit line precharge power line VBP[n] is activated. In addition, if the memory array block 4001 connected to the bit line precharge power line VBP[0] is activated, then time is required before detection by the operational amplifier 4301, but from the fact that a voltage drop occurs near the power circuit, the precharge operation is not subject to delays that would cause a problem. Consequently, the precharge operation can be performed at high speeds for the entire memory array 4000.

Embodiment 5

Figure 14:
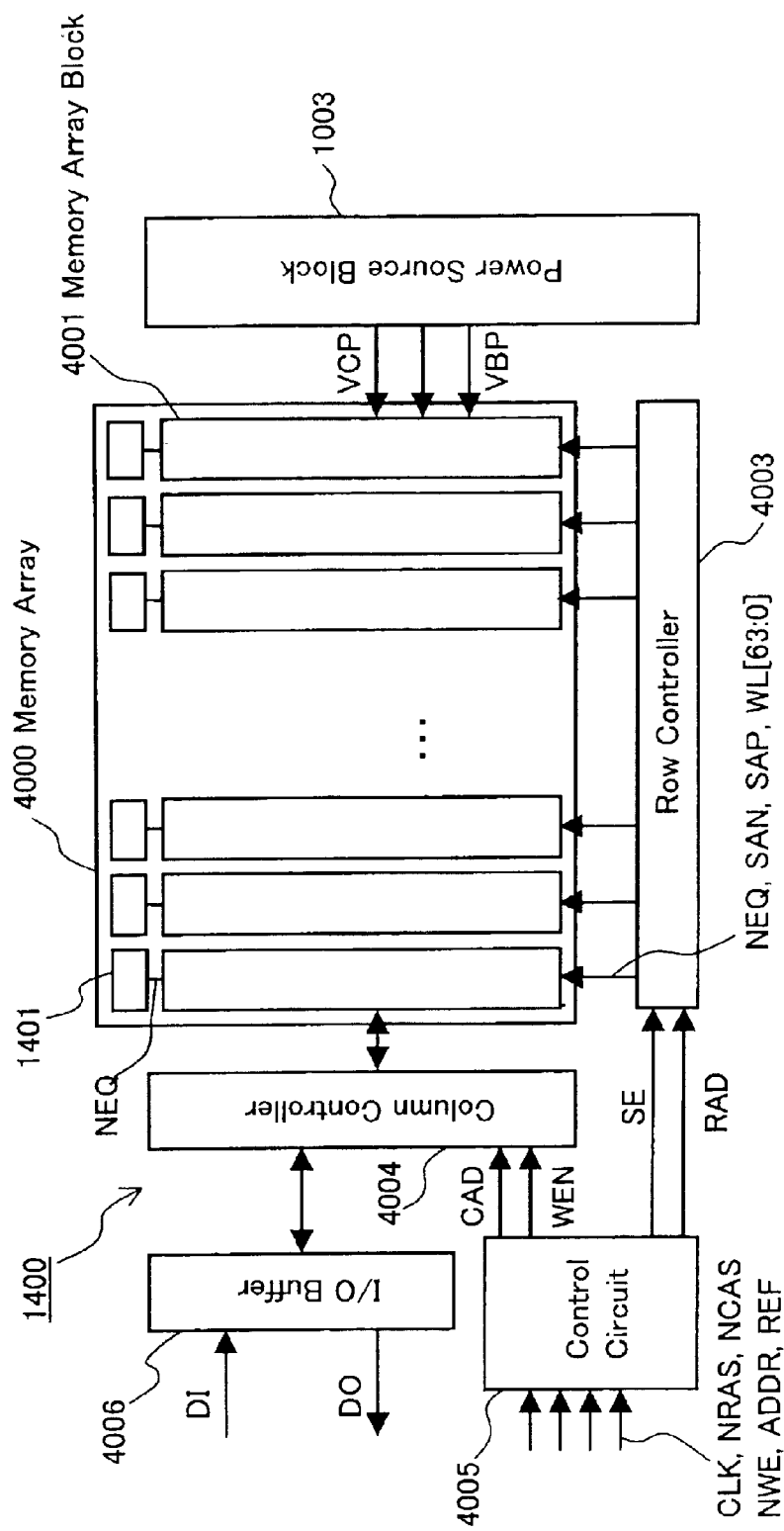
FIG. 14 is a circuit block diagram of a semiconductor memory device according to Embodiment 5.

FIG. 14 illustrates a circuit block diagram of a semiconductor memory device 1400 according to Embodiment 5 of the present invention. Elements assigned reference numerals that are identical to those in the conventional example or in the above embodiments have identical configurations. In this embodiment, noise canceling circuits 1401 have been added. The noise canceling circuits 1401 are disposed in the memory array 4000 and joined to the bit line precharge signal NEQ that passes through the memory array blocks 4001.

Figure 15:
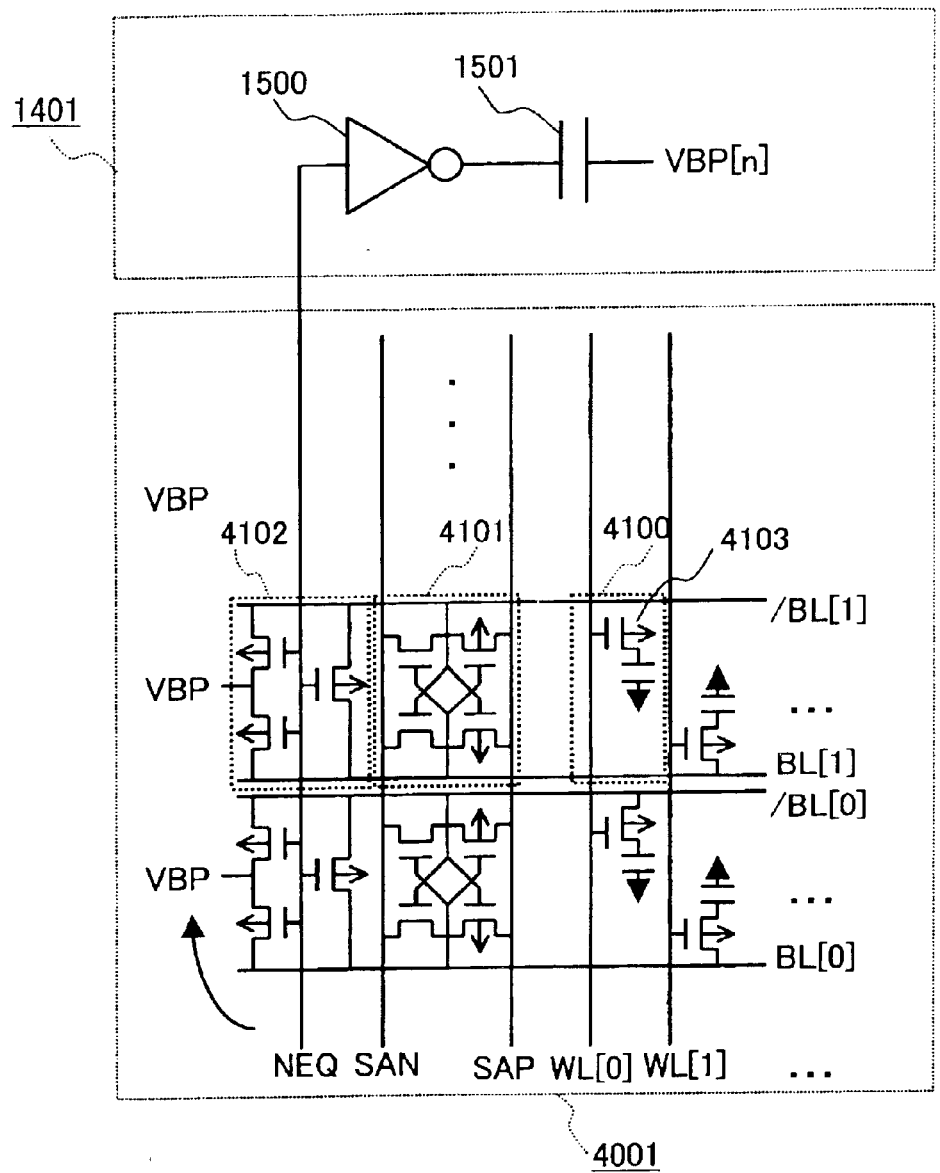
FIG. 15 is a circuit diagram of a noise canceling circuit and a memory array block according to Embodiment 5.

FIG. 15 shows a circuit diagram of a noise canceling circuit 1401 and a memory array block 4001. Numeral 1500 denotes a fourth inverter and 1501 denotes a second capacitor. The circuit configuration of the memory array block 4001 is identical to that of the conventional example.

The fourth inverter 1500 receives as input the bit line precharge signal NEQ, and the output of the fourth inverter 1500 is connected to the second capacitor 1501. The other terminal of the second capacitor 1501 is connected to the bit line precharge power line VBP[n]. The capacitance of the second capacitor 1501 is set identical to the parasitic capacitance that is present, via the transistors, between the bit line precharge signal NEQ and the bit line precharge power line VBP[n].

When the bit line precharge signal NEQ is driven at a high or low level, noise is generated in the bit line precharge power line VBP[n] via the parasitic capacitance that exists via the transistors. With this configuration, that noise can be cancelled out by the coupling capacitance of the second capacitor 1501. Consequently, the bit lines can be precharged with greater precision.

Embodiment 6

Figure 16:
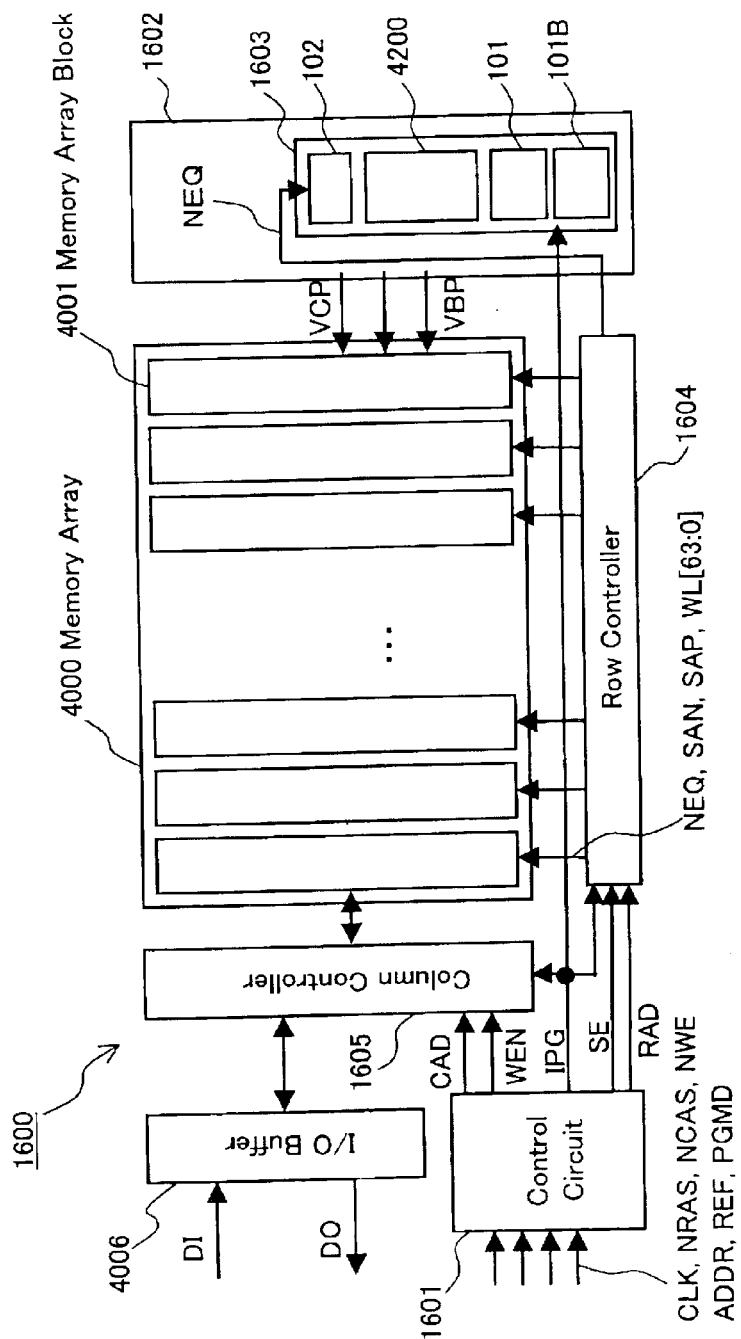
FIG. 16 is a circuit block diagram of a semiconductor memory device according to Embodiment 6.

FIG. 16 shows a circuit block diagram of a semiconductor memory device 1600 according to Embodiment 6 of the present invention. Elements assigned reference numerals that are identical to those in the conventional example or in the above embodiments have identical configurations. The elements that are different are a control circuit 1601, a power source block 1602, a bit line precharge voltage generating device 1603, a second charge tank circuit 101B, a row controller 1604, and a column controller 1605.

The control circuit 1601 receives as input the outside clock signal CLK, the row address strobe signal NRAS, the column address strobe signal NCAS, the write control signal NWE, the address ADDR, the refresh control signal REF, and a page length control signal PGMD. An inside page mode control signal IPG that is output from the control circuit 1601 is input to the column controller 1605, the row controller 1604, and the bit line precharge voltage generating device 1603.

Figure 17A:
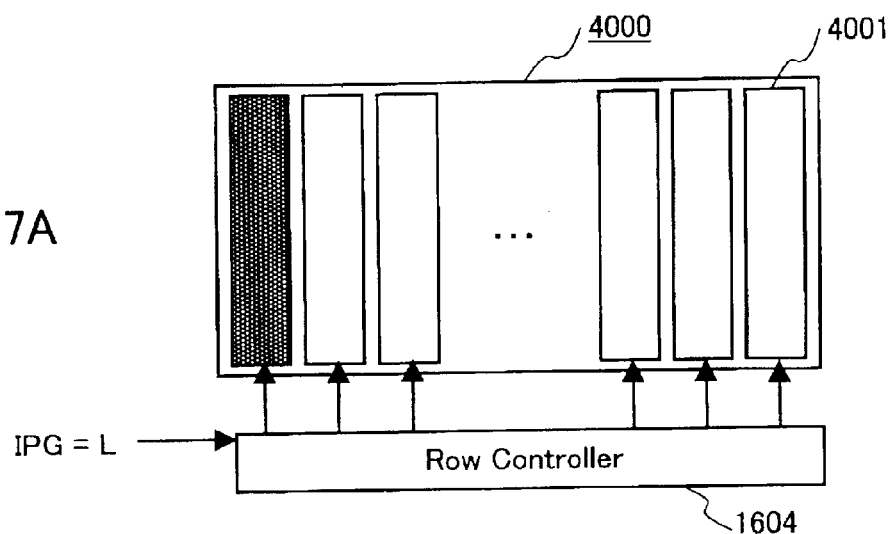
FIGS. 17A and 17B are diagrams for explaining the selection of an active block of the semiconductor memory device according to Embodiment 6.
Figure 17B:
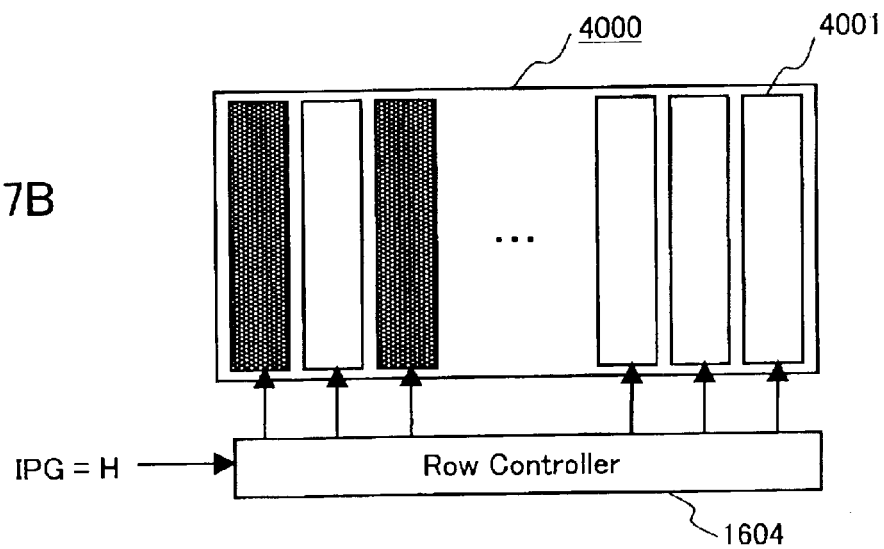

FIGS. 17A and 17B explain the selection of the active blocks of the semiconductor memory device according to this embodiment. As shown in FIG. 17A, when the inside page mode control signal IPG is at a low level, the bit line precharge signal NEQ, the sense amplifier activation signals SAN and SAP, and the word line drive signal WL[63:0] are output from the row controller 1604 to a single memory array block 4001. As shown in FIG. 17B, when the inside page mode control signal IPG is at a high level, the bit line precharge signal NEQ, the sense amplifier activation signals SAN and SAP, and the word line drive signal WL[63:0] are output to two memory array blocks 4001.

Figure 18:
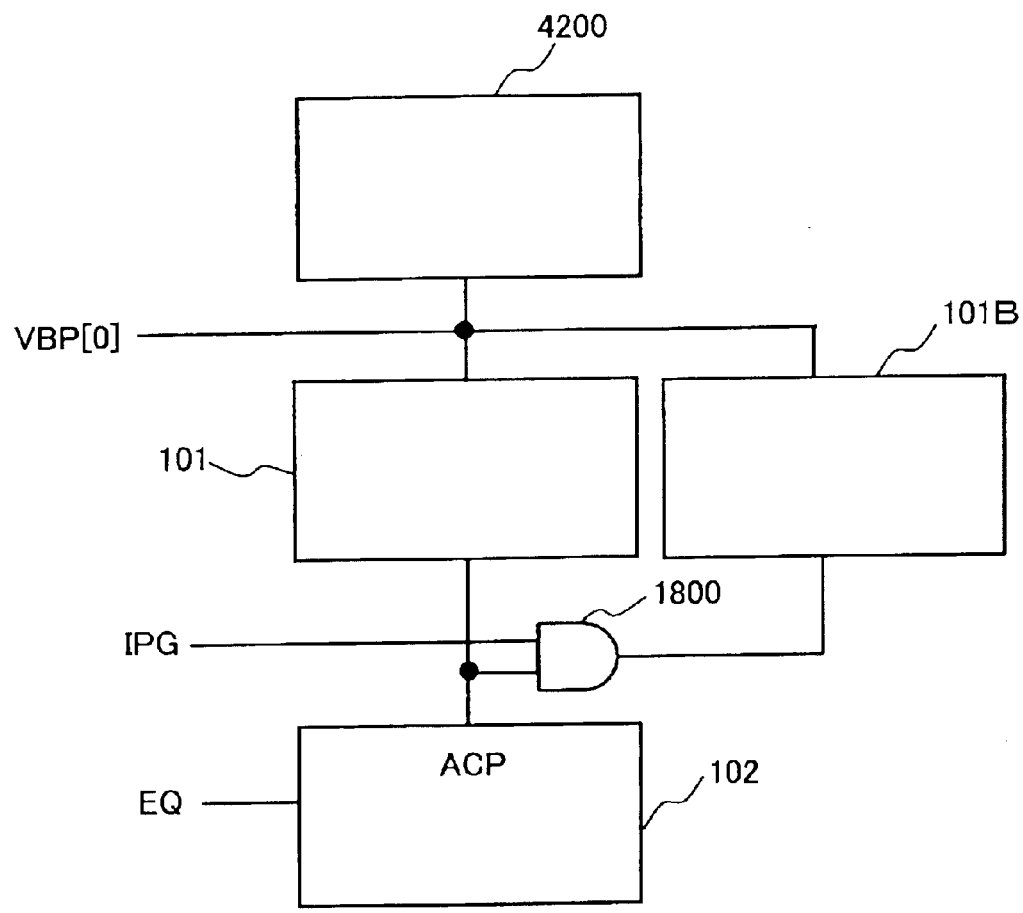
FIG. 18 is a block diagram of a bit line precharge voltage generating device according to Embodiment 6.

FIG. 18 shows a block diagram of the bit line precharge voltage generating device 1603 according to this embodiment. Numeral 1800 denotes a third AND element. The output of the precharge voltage generating circuit 4200, the output of the charge tank circuit 101, and the output of the second charge tank circuit 101B are connected to the bit line precharge power line VBP[0]. The circuit configuration of the second charge tank circuit 101B is identical to that of the charge tank circuit 101 shown in FIG. 2. The capacitance of the first capacitors 200 that are arranged in the charge tank circuit 101 and in the second charge tank circuit 101B is set to the capacitance that is required for charging the bit lines BL[n], /BL[n] arranged in a single memory array block 4001.

The buffer inverter 205 in the charge tank 101 receives the transfer gate connection signal ACP that is output from the charge/discharge control circuit 102. The buffer inverter 205 in the second charge tank circuit 101B receives the output of the third AND element 1800. The third AND element 1800 receives the inside page mode control signal IPG and the transfer gate control signal ACP that is output from the charge/discharge control circuit 102.

The above configuration operates as follows. When the inside page mode control signal IPG is at a low level, the bit line precharge signal NEQ is set to a low level, and when the precharge operation is started, the bit lines BL[n], /BL[n] disposed inside the single activated memory array block

4001 are precharged. At that time, only the charge tank circuit 101 is operated and the second charge tank circuit 101B is stopped. When the inside page mode control signal IPG is at a high level, the bit line precharge signal NEQ is set to a low level, and when the precharge operation is started, the bit lines BL[n], /BL[n] disposed inside the two activated memory array blocks 4001 are precharged. At this time, the charge tank circuit 101 is operated, and the output of the third AND element 1800 become high level and the second charge tank circuit 101B is operated.

According to this configuration, even if the number of memory array blocks 4001 that are simultaneously activated is different, the precharge operation can be performed at high speeds for each one, and thus the operation speed can be increased.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device comprising:

a plurality of memory cells;

bit line pairs to which the memory cells are connected;

a plurality of precharge circuits for precharging the bit line pairs to a first voltage that is different from a mean value between a high level and a low level, in accordance with a first control signal;

a bit line precharge power line for supplying the first voltage for precharging to the precharge circuits;

a first capacitor;

a charging circuit for charging the first capacitor;

a transfer gate circuit for controlling connection and disconnection between the first capacitor and the bit line precharge power line; and a first control circuit for controlling the charging circuit and the transfer gate circuit;

wherein the first control circuit, in accordance with a second control signal, controls the transfer gate circuit so that during precharging of the bit line pairs, the first capacitor and the bit line precharge power line are connected.

2. The semiconductor memory device according to claim 1, further comprising a reference voltage generating circuit for generating a second voltage, and a comparing and driving circuit for driving the bit line precharge power line at the first voltage in accordance with reference to the second voltage.

3. The semiconductor memory device according to claim 1, wherein the first capacitor is made of a first MOS transistor whose source and drain are grounded;

the charging circuit comprises a first p-channel MOS transistor whose gate is connected to the second control signal, whose source is connected to a first outside power source, and whose drain is connected to the gate of the first MOS transistor; and the transfer gate circuit comprises a first n-channel MOS transistor into whose gate the second control signal is input, whose source is connected to the gate of the first MOS transistor, and whose drain is connected to the precharge circuit, a first inverter into whose input the second control signal is supplied, and a second p-channel MOS transistor into whose gate an output of the first inverter is input, whose source is connected to the gate of the first MOS transistor, and whose drain is connected to the precharge circuit.

4. The semiconductor memory device according to claim 1, wherein the first control circuit, after a first delay time that starts when the first control signal has become a voltage that activates the preeharge circuit, controls the second control signal to a first voltage level so that the first capacitor and the bit line precharge power line are connected, and after a further second delay time; the first control circuit controls the second control signal to a voltage of a phase opposite the first voltage level.

5. The semiconductor memory device according to claim 2, wherein when a difference between a first outside power source voltage and the second voltage is taken as a first voltage difference, a difference between the second voltage and the mean voltage of the voltages of the bit line pairs is taken as a second voltage difference, and a total capacitance of simultaneously precharged bit line pairs is taken as a first capacitance, then a capacitance of the first capacitor is equivalent to a second capacitance obtained by multiplying the first capacitance with the ratio of the second voltage difference to the first voltage difference.

6. The semiconductor memory device according to claim 2, wherein when a difference between a first outside power source voltage and the second voltage is taken as a first voltage difference, a difference between the second voltage and the mean voltage of the voltages of the bit line pairs is taken as a second voltage difference, and a total capacitance of simultaneously precharged bit line pairs is taken as a first capacitance, then a capacitance of the first capacitor is a value of approximately 50% to 80% that of a second capacitance obtained by multiplying the first capacitance with the ratio of the second voltage difference to the first voltage difference.

7. The semiconductor memory device according to claim 1, wherein the plurality of memory cells are refreshed in correspondence with a refresh control signal, wherein during a refresh operation, a greater number of bit line pairs are activated than in nominal operation, and wherein the first control circuit enables a connection of the transfer gate circuit in correspondence with the first control signal only when the level of the refresh control signal indicates the refresh operation.

8. The semiconductor memory device according to claim 1, wherein responsive to a test signal, when not in test mode, the transfer gate circuit is connected in correspondence with the first control signal, and when in test mode, the first control circuit is stopped and the output of the first control circuit becomes high impedance, and the transfer gate circuit is disconnected.

9. The semiconductor memory device according to claim 2, wherein the comparing and driving circuit compares the second voltage to a voltage of a portion of the bit line precharge power line coupled to the precharge circuit, of the plurality of precharge circuits, that is disposed around the portion farthest from the comparing and driving circuit, and based on a result of this comparison, drives a voltage of a portion of the bit line precharge power line that is closest or near to the comparing and driving circuit.

10. The semiconductor memory device according to claim 1, wherein the plurality of memory cells are divided into a plurality of memory array blocks and each memory array block includes a plurality of memory cell; connected to the plurality of precharge circuits that are simultaneously driven by the first control signal, and a noise canceller is disposed on each memory array block, wherein the noise canceller comprises a second inverter and a second capacitor, the first control signal is input to the second inverter, an output of the second inverter is input to a terminal of the second capacitor, and the bit line precharge power line is coupled to another terminal of the second capacitor.

11. A semiconductor memory device comprising:

a plurality of memory cells;

bit line pairs to which the memory cells are connected;

a plurality of precharge circuits for precharging the bit line pairs to a first voltage that is different from a mean value between a high level and a low level, in accordance with a first control signal;

a bit line precharge power line for supplying the first voltage for precharging to the precharge circuits;

a plurality of capacitor circuits; and a first control circuit for controlling the capacitor circuits;

wherein each capacitor circuit comprises a first capacitor, a charging circuit for charging the first capacitor, and a transfer gate circuit for controlling connection and disconnection between the first capacitor and the bit line precharge power lines; and wherein the first control circuit, in accordance with a third control signal for controlling the number of bit line pairs that are simultaneously activated, changes the number of the plurality of capacitor circuits that are activated, and only in a capacitor circuit that is activated, the transfer gate circuit is controlled in accordance with a second control signal so that the first capacitor and the bit line precharge power line are connected during precharging of the bit line pairs.

* * * * *